United States Patent [19]
Tani et al.

[11] Patent Number: 5,539,403
[45] Date of Patent: Jul. 23, 1996

[54] D/A CONVERSION APPARATUS AND A/D CONVERSION APPARATUS

[75] Inventors: Yasunori Tani, Osaka; Tetsuhiko Kaneaki, Ashiya; Akira Sobajima, Hirakata; Hideaki Hatanaka, Kadoma; Yoshihiko Fukumoto, Joyo, all of Japan

[73] Assignee: Matsushita Electric Industrial Co, Ltd, Osaka, Japan

[21] Appl. No.: 185,876

[22] PCT Filed: May 28, 1993

[86] PCT No.: PCT/JP93/00717

§ 371 Date: Jan. 6, 1994

§ 102(e) Date: Jan. 6, 1994

[87] PCT Pub. No.: WO93/25006

PCT Pub. Date: Dec. 9, 1993

[30] Foreign Application Priority Data

Jun. 1, 1992 [JP] Japan ................................. 4-140223
Feb. 23, 1993 [JP] Japan ................................. 5-033051

[51] Int. Cl.⁶ .................................................. H03M 1/66
[52] U.S. Cl. .................................................. 341/144
[58] Field of Search ................................. 341/144, 136, 341/143, 152, 145

[56] References Cited

U.S. PATENT DOCUMENTS 4,414,641  11/1983  Jarrett ..................... 341/144 X
5,343,197   8/1994  Kanai et al. ............... 341/152

FOREIGN PATENT DOCUMENTS 3-19524    1/1991  Japan .
3-143026   6/1991  Japan .
4-72820    3/1992  Japan .
4-152715   5/1992  Japan .

*Primary Examiner*—Brian K. Young
*Attorney, Agent, or Firm*—Panitch Schwarze Jacobs & Nadel

[57] ABSTRACT

It purposes to provide a D/A conversion apparatus of a high accuracy oversampling method by noise shaping which is not needed a high frequency clock or accurate working, and a high accuracy A/D conversion apparatus having a configuration to which said D/A conversion technology is applied. It has configuration outputting the digital signal by dividing to plural 1-bit D/A converters, and by using said D/A converters so as to circulate, correlation of the signal and the output value of a specified 1-bit D/A converter is canceled, and noise or distortion due to a relative error of the 1-bit D/A converter is reduced.

30 Claims, 15 Drawing Sheets

D/A CONVERSION APPARATUS AND A/D CONVERSION APPARATUS

FIELD OF THE INVENTION

The present invention relates to a D/A (digital/analog) conversion apparatus for converting a digital signal to an analog signal, and an A/D (analog/digital) conversion apparatus for converting the analog signal to the digital signal, and particularly relates to a D/A conversion apparatus and an A/D conversion apparatus of oversampling type for performing D/A conversion, A/D conversion with a sampling frequency which is higher than a sampling frequency of the digital signal.

BACKGROUND OF THE INVENTION

As one of a D/A conversion apparatus, a D/A conversion apparatus using a noise shaper and a PWM is reported. The D/A conversion apparatus of this method which have been reported hitherto is elucidated by using FIG. 24. Incidentally, this technology is described in "National Technical Report (Volume 34, No. 2, April 1988) pp. 40–45", for example.

FIG. 24 is a block diagram showing an example of a conventional D/A conversion apparatus. Numeral 10 designates a digital filter (DF), and which multiplies a sampling frequency fs of an inputted digital signal by k (k≧2). Herein, it is set to k=64. Numeral 11 designates the noise shaper (NS), and word length limitation of the digital signal which is output from the DF 10 is performed, and frequency characteristic of noise is changed to a predetermined characteristic thereby. Herein, it is provided that a noise shaper of third order characteristic is used and an output Y with respect to an input X is represented by an equation (1):

$$Y = X + (1 - z^{-1})^3 \cdot Vq \qquad (1)$$

where,

Vq: quantizing error, $z^{-1} = \cos\theta - j \cdot \sin\theta$, j: imaginary number unit.

Moreover, it is provided that the output Y has an output of 11 level (=p). Numeral 19 designates a pulse width modulation circuit (PWM=pulse width modulator), and which converts to a pulse signal of 1-bit having 11 ways of pulse width corresponding to the digital signal output from the NS 11, and outputs as an analog signal. The D/A conversion apparatus of FIG. 24 further converts to the analog signal by using a clock of at least 704 times (=64×11) by the PWM 19, after a digital input signal is made to 64 fs of sampling frequency and 11 levels by the DF 10 and the NS 11, and is a D/A conversion apparatus of so called oversampling type for converting the digital signal to an analog signal with a higher sampling frequency.

Further detailed configuration of the NS 11 of FIG. 24 is shown in FIG. 25. Numeral 50 designates a first order ΔΣ modulator (1st order delta-sigma modulator) which outputs by performing quantization of the input X and change of the frequency characteristic of the noise and extracts a quantizing error component -Vq1 and outputs to a next step. An output Y1 with respect to the input X is represented by an equation (2):

$$Y1 = X + (1 - z^{-1}) \cdot Vq1 \qquad (2)$$

where,

Vq1: quantizing error.

Moreover, it is here assumed that the output Y1 has outputs (−3–+3) of seven levels (=p1). Numeral 51 designates a second order ΔΣ modulator, and the quantizing error component -Vq1 of the first order ΔΣ modulator 50 and performs quantization of the above-mentioned input -Vq1 and outputs change of the frequency characteristic of the noise. An output Y2 with respect to the input -Vq1 is represented by an equation (3):

$$Y2 = Vq1 + (1 - z^{-1})^2 \cdot Vq2 \qquad (3),$$

where,

Vq2: quantizing error.

Moreover, it is here assumed that the output Y2 has outputs (−1, 0, +1) of 3 levels. Numeral 52 designates a differentiator, and the output Y2 is digital-differentiated and is output. An output Y2' with respect to the input Y2 of the differentiator 52 is represented by an equation (4):

$$\begin{aligned} Y2' &= (1 - z^{-1}) \cdot Y2 \\ &= -(1 - z^{-1}) \cdot Vq1 + (1 - z^{-1})^3 \cdot Vq2. \end{aligned} \qquad (4)$$

The output Y2' at this time has outputs (−2–+2) of 5 levels (=p2). Numeral 53 designates an adder, and the output Y of the NS 11 is obtained by adding the outputs Y1 and Y2'.

In the D/A conversion apparatus of FIG. 24, result derived by simulation on output signal spectrum in the case of 64 fs of sampling frequency (FS), about 0.02 fs of input signal frequency and 0 dB of the input signal level is shown in FIG. 26. For simplicity, a signal until 0–2 fs is shown here. As mentioned above, although a digital signal of only 11 levels is converted into an analog signal, as shown in FIG. 26, a dynamic range (D.R.) of 120 dB or more is obtained in a signal band of 0–fs/2 by the NS 11.

However, in the configuration shown in FIG. 24, the PWM 19 requires a clock frequency of at least 704 fs. For example, in the case of a sampling frequency fs=48 kHz which is widely used in a digital audio, it becomes extremely high clock frequency such as 704 fs=33.792 MHz, and there is a problem in actual use so that countermeasure to electromagnetic interference or electro-magnetic disturbance is required.

In the case that the D/A conversion is performed by a method except for the PWM, operation by a clock which is lower than the case of the PWM is possible. For example, a D/A conversion circuit using a resistor array is usable. However, extremely high relative-accuracy is required in the resistor array for this purpose. The reason is that the digital signal which is limited in word length by the NS 11 maintains a high accuracy of 120 dB or more in the original signal band (0–fs/2) in spite of a little word length as mentioned above. Namely, the accuracy of the D/A conversion is decided by the accuracy of the resistor array. And there is such a problem that fabrication of the D/A conversion circuit becomes difficult because the resistor array of the high accuracy is required in order to the D/A conversion of the high accuracy.

By the way, an A/D conversion apparatus of over-sampling type based on a similar concept have been reported. The higherto reported A/D conversion apparatus of this method is elucidated by using FIG. 27. This technology is described in "Institute of Electronics, Information and Communication Engineers Technical Report CS83-198".

FIG. 27 is a block diagram showing an example of the conventional A/D conversion apparatus. Referring to FIG. 27, numeral 70 designates a subtracter which outputs a difference of two analog signals inputted thereto. An analog input from outside is inputted to an addition adding terminal of the subtracter 70. Numeral 71 designates an integrator, and an analog signal output from the subtracter 70 is output by accumulating. Numeral 72 designates a quantizer, and which makes a digital output by converting the analog signal output from the integrator 71 to the digital signal. It is here assumed that quantization of 2 bits (p=4 ways) is performed, and correspondence between input and output is shown in Table 1. Here, it is assumed that the analog input is signals of ±1.

TABLE 1

| Input value of quantizer 72 | Output value of quantizer 72 |
|---|---|
| +1.0 ... +∞ | +1.5 |
| 0.0 ... +1.0 | +0.5 |
| −1.0 ... 0.0 | −0.5 |
| −∞ ... −1.0 | −1.5 |

Numeral 79 designates a D/A converter, which converts the output of the quantizer 72 to an analog signal. The output of the D/A converter 79 is inputted to a subtraction terminal of the subtracter 70.

The A/D conversion apparatus of FIG. 27 is known as the A/D converter of a noise shaping type of first order characteristic, and the output Y with respect to the input X is represented by an equation (5):

$$Y = X + (1-z^{-1}) \cdot Vq \quad (5),$$

where, $Vq$: quantizing error of quantizer 72, $z^{-1} = \cos \theta - j \cdot \sin \theta$, j: imaginary number unit.

In the A/D conversion apparatus of FIG. 27, result derived by simulation on output signal spectrum in the case of 64 fs of sampling frequency (FS), about 0.02 fs of input signal frequency and 0 dB of input signal level is shown in FIG. 28. For simplicity, a band until 0–2 fs is shown here. As shown in FIG. 28, a dynamic range (D.R.) of about 57 dB is obtained in the signal band of 0–fs/2.

However, in the configuration shown in FIG. 27, it is considered that the D/A converter 79 requires an accuracy of at least the order of the digital signal to be obtained. For example, the case in which the output of the D/A converter 79 has 3% of error as shown in Table 2 is presumed.

TABLE 2

| Input value of D/A converter 79 | Output value of D/A converter 79 |
|---|---|
| +1.5 | 1.50 |
| +0.5 | 0.50 |
| −0.5 | −0.48 |
| −1.5 | −1.50 |

Result derivewd by simulation on output signal spectrum in this case is shown in FIG. 29. For simplicity, a band until 0–2 fs is shown here. As shown in FIG. 29, generation of large harmonic distortion is observed, and the dynamic range is seriously deteriorated to about 45 dB in the signal band of 0–fs/2.

This cause is that the output of the D/A converter 79 has nonlinear characteristic. Therefore, in order to obtain a high dynamic range, there is a subject in which a device of high accuracy has to be used for the D/A converter 79.

SUMMARY OF THE INVENTION

The present invention is for resolving the above-mentioned conventional subject and purposes to provide a D/A conversion apparatus which does not require a high clock frequency such as a PWM and moreover does not require a high accuracy in the D/A conversion circuit, and to provide an A/D conversion apparatus which does not require a device of a high accuracy for the D/A converter 79.

In order to achieve this purpose, the present invention is configured as below-mentioned. Namely, (1) it comprises a digital filter for multiplying sampling frequency of an inputted digital signal by k (k≧2), a noise shaper to which the output of the above-mentioned digital filter is inputted and a frequency characteristic of noise is changed to a predetermined characteristic with word length limitation, a decoder to which the output of the above-mentioned noise shaper is inputted and for converting to 1-bit signal array corresponding to the value of the above-mentioned input, 1-bit D/A converter array which is comprised of plural 1-bit D/A converters for converting the output of the above-mentioned decoder to an analog signal and an analog adder for totalizing the outputs of the above-mentioned 1-bit D/A converter array; and it is made a D/A conversion apparatus in which the output of the above-mentioned decoder is made to an output so that 1-bit signals of the number corresponding to the output value of the above-mentioned noise shaper circulate.

Moreover, the present invention, (2) comprises the digital filter for multiplying the sampling frequency of the inputted digital signal by k (k≧2), a noise shaper of a multi step quantization type to which the output of the above-mentioned digital filter is inputted and for changing frequency characteristic of noise to a predetermined characteristic with word length limitation, plural number of decoder to which outputs of the respective steps of the above-mentioned noise shaper are inputted and for converting to 1-bit signal array corresponding to the values of the above-mentioned inputs, 1-bit D/A converter array which is comprised of plural number of 1-bit D/A converter for converting the respective outputs of the above-mentioned decoder to analog signals and an analog adder for totalizing the outputs of the above-mentioned 1-bit D/A converter array; and it is made a D/A conversion apparatus in which the output of the above-mentioned decoder is made to an output so that the 1-bit signals of the number corresponding to the value of the output of the above-mentioned noise shaper circulate.

Moreover, the present invention, (3) comprises a subtracter to which two analog signals are inputted and outputs a difference of both, an integrator for integrating an analog output of the above-mentioned subtracter, a quantizer for converting the output of the above-mentioned integrator to a digital signal, a decoder for converting the digital output of the above-mentioned quantizer to a 1-bit signal array corresponding to the value of the above-mentioned signal, a 1-bit D/A converter array for converting the output of the above-mentioned decoder to the analog signal, respectively and an analog adder for totalizing the outputs of the above-mentioned 1-bit D/A converter array and output to the subtraction terminal of the above-mentioned subtracter; and it is made an A/D conversion apparatus in which the analog input is inputted to the addition terminal of the above-mentioned subtracter, the digital output is output from the above-mentioned quantizer and the outputs of the above-mentioned decoder is made to an output so that the 1-bit signals of the number corresponding to the value of the output of the above-mentioned quantizer circulate.

Moreover, the present invention, (4) comprises a first subtracter to which two analog signals are inputted and a difference of both is output, a first integrator for integrating the analog output of the above-mentioned first subtracter, a second subtracter to which the analog output of the above-mentioned first integrator is inputted to the addition terminal, a second integrator for integrating the analog output of the above-mentioned second subtracter, a quantizer for converting the output of said second integrator to a digital signal, a decoder for converting the digital output of the above-mentioned quantizer to a 1-bit signal array corresponding to the value of the above-mentioned signal, a 1-bit D/A converter array for converting the output of the above-mentioned decoder to the analog signals, respectively and an analog adder for totalizing the outputs of the above-mentioned 1-bit D/A converter array and for outputting to the subtraction terminals of the above-mentioned first and second subtracters; and it is made an A/D conversion apparatus in which analog input is inputted to the addition terminal of the above-mentioned first subtracter, the digital output is output from the above-mentioned quantizer, and the output of the above-mentioned decoder is made to an output so that the 1-bit signals of the number corresponding to the value of the output of the above-mentioned quantizer circulate.

By the above-mentioned configuration, the present invention is that the sampling frequency in the D/A conversion may be identical with the sampling frequency of the digital output of the noise shaper, and operation in a clock frequency which is far lower in comparison with the PWM is capable by converting the output of the noise shaper in the D/A converter to the 1-bit signal array by the decoder and by converting to the analog signal by the 1-bit D/A converter array. Moreover, correlation between the output value of the noise shaper and a particular 1-bit D/A converter is canceled by the decoder's allotting of the output of the noise shaper to the plural number of 1-bit D/A converter so as to circulate. By this, even in the case that a relative error (dispersion) is included in the output between the respective 1-bit D/A converters, generation of distortion and noise in the signal band may be reduced.

DETAILED DESCRIPTION OF THE INVENTION

Hereafter, embodiments of the present invention are elucidated with reference to figures.

Figure 1:
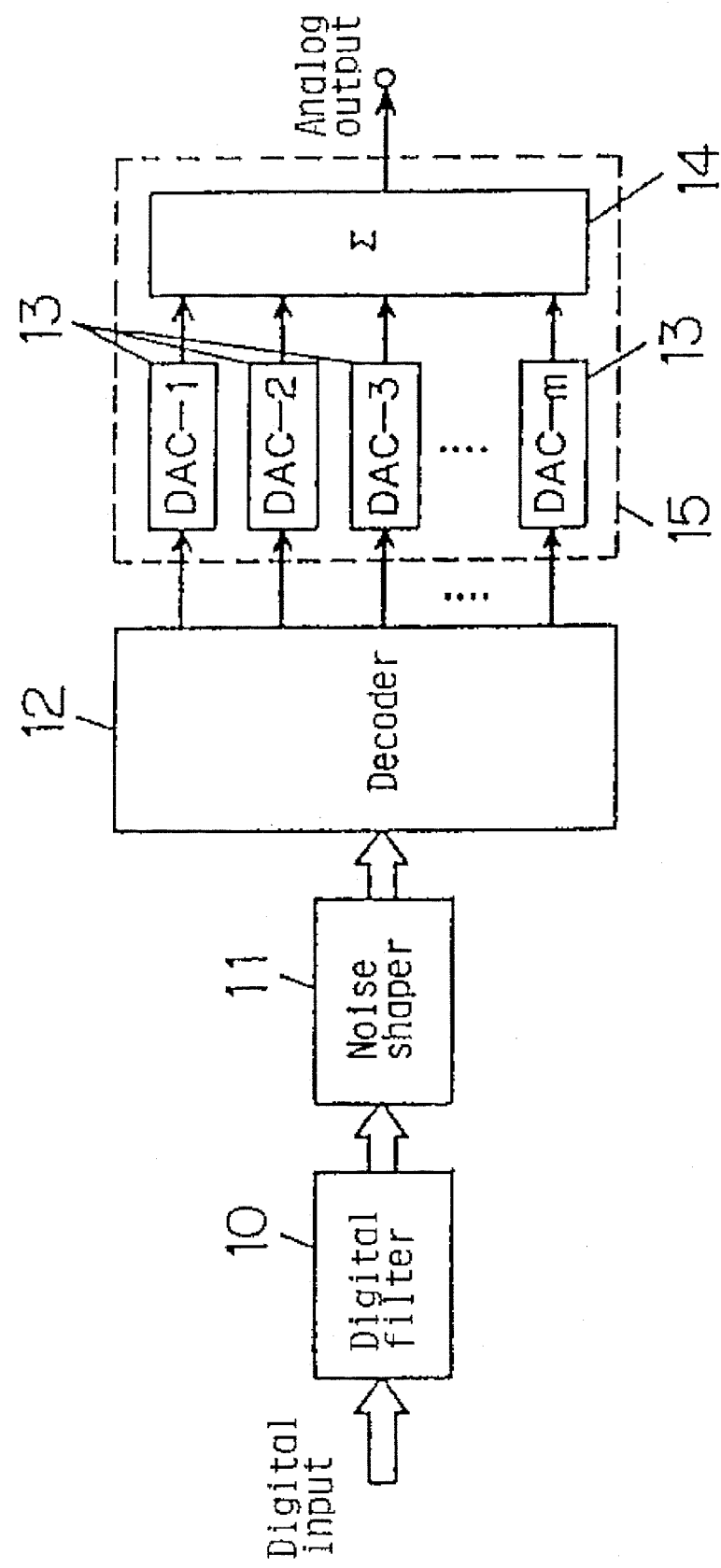
FIG. 1 is a block diagram representing an embodiment of the D/A conversion apparatus in accordance with the present invention.
Figure 24:
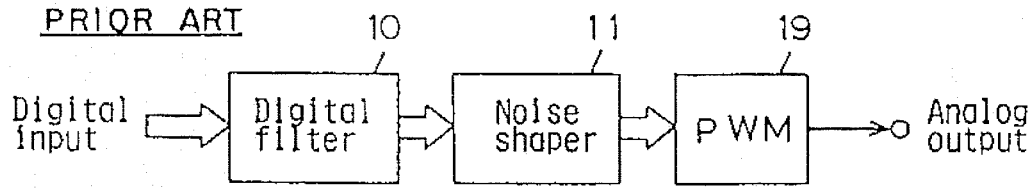
FIG. 24 is the block diagram representing an example of the conventional D/A conversion apparatus.

FIG. 1 is a block diagram representing an embodiment of the D/A conversion apparatus in accordance with the present invention. In FIG. 1, numeral 10 designates a digital filter (DF), numeral 11 designates a noise shaper (NS), and both have the same configuration & function as those shown in FIG. 24. Numeral 12 designates a decoder (DEC), and 1-bit signals of the number of m are output in correspondence to the digital signal which is output from the NS 11. Numeral 13 designates a 1-bit D/A converter array (DAC), which is comprised of uniform m number of 1-bit D/A converters from a first D/A converter (DAC-1) to an m-th D/A converter (DAC-m). Numeral 14 designates an analog adder, which totalizes analog signals of the number of which are output from the DAC 13 and outputs as an analog signal. Numeral 15 designates a D/A conversion circuit, which is comprised of the DAC 13 and the analog adder 14. The D/A conversion apparatus of FIG. 1, after making a digital input signal to the sampling frequency of 64 fs, the level of 11 (=p) by the DF 11 and the NS 11, it is made into bit signal of the number of m by the DEC 12 and moreover is converted to an analog signal by the D/A conversion circuit 15; and it is formed the D/A converter of so-called oversampling type which converts the digital signal to the analog signal with a higher sampling frequency.

Figure 2:
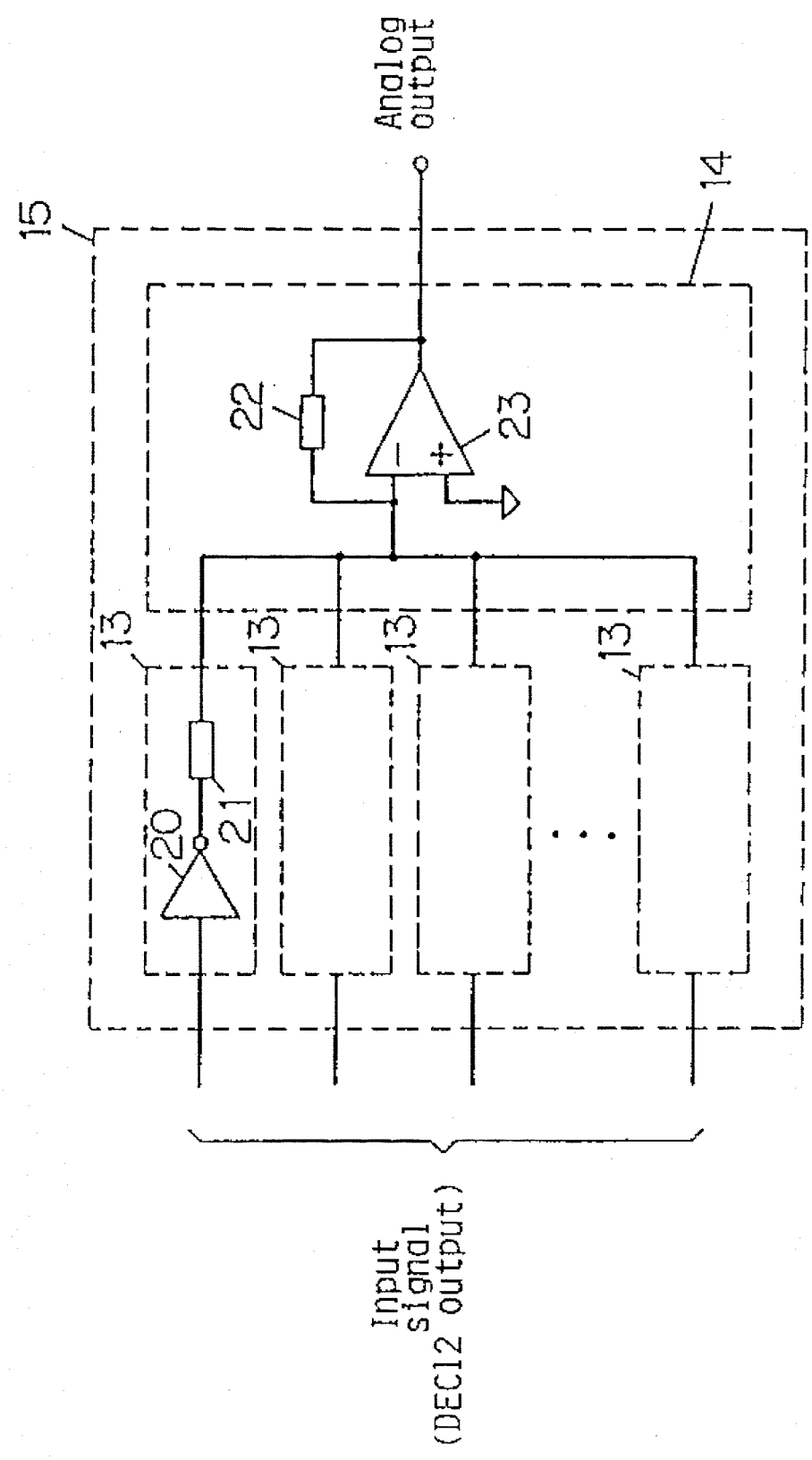
FIG. 2 is a circuitry representing an example of the D/A conversion circuit 15 of FIG. 1.

An example of the D/A conversion circuit 15 of FIG. 1 is shown in FIG. 2. In FIG. 2, numeral 13 designates a 1-bit D/A converter array (DEC), numeral 14 designates an analog adder, numeral 15 designates a D/A conversion circuit, and each corresponds to FIG. 1. Numeral 20 is an inverter, and which outputs by inverting a 1-bit input signal. Numerals 21, 22 designate resistors, numeral 23 designates an operational amplifier (operacional amplifier). Operation of FIG. 2 is elucidated, first, a non-invert input terminal of the operational amplifier 23 is grounded, and an invert input terminal is made to a virtual ground point. Moreover, all of the 1-bit input signals are connected to the invert input terminal of the operational amplifier 23 through the resistor 22. Namely, a current adding circuit by the resistors 21, 22 is formed. It is now assumed that the resistance value of the resistor 21 of the DAC-1 is R1, the resistance value of the resistor 21 of the DAC-2 is R2, . . . , the resistance value of the resistor 21 of the DAC-m is Rm and the resistance value of the resistor 22 is Rf, an analog output voltage Eo is derived by equation (6):

$$Eo = Rf \cdot V \cdot \left( \frac{S1}{R1} + \frac{S2}{R2} + \ldots + \frac{Sm}{Rm} \right), \quad (6)$$

where,

V: inverter output voltage,

Si: inverter output logic (i=1, 2, . . . , m), $$Si = \begin{cases} 1: \text{when the inverter output is ``1''}, \\ 0: \text{when the inverter output is ``0''}. \end{cases}$$

Here, since all of the DAC 13 have uniform configuration, the resistance value of the resistor 21 is also R1=R2=. . . =Rm, and the output of the operational amplifier 23 namely the analog output is made to output a voltage value which is in proportion to the number of signal which is "0" (namely the output of the inverter 20 is "1") in the 1-bit input signals.

In an actual circuit, it is impossible to make the resistor 21 of the DAC 13 with perfect uniformity, and some relative error exists. In this case as being apparent from the equation (6), a voltage value depending on a position as well as the number of signal which is "0" in the 1-bit input signals is output.

Figure 3:
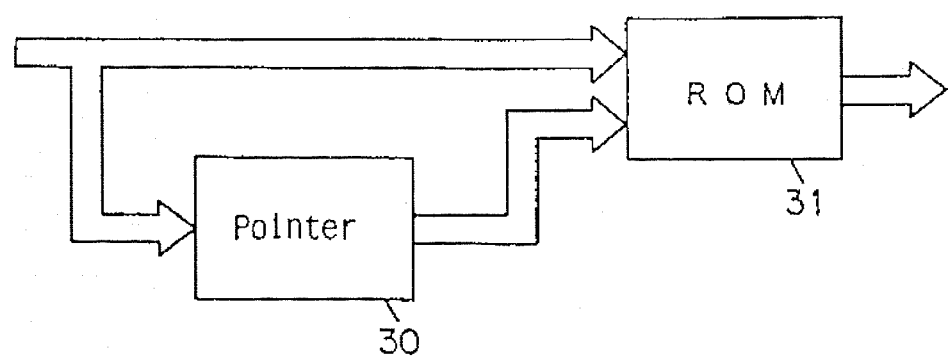
FIG. 3 is a block diagram representing an example of a decoder 12 of FIG. 1.

An example of the DEC 12 of FIG. 1 is shown in FIG. 3. In FIG. 3, numeral 30 designates a pointer, which outputs a remnant of an accumulation value of the input signal. Numeral 31 designates a ROM (read only memory), which outputs data of m bits corresponding to the address in which the input signal is a lower digit and the output of the pointer 30 is an upper digit. It is here assumed that m=10 (p−1). Operation of FIG. 3 is elucidated, first, the pointer 30 accumulates the signals (0–10) of 11 levels output from the NS 11 of FIG. 1, and the remnant of 10 is derived and is output. Therefore, the above-mentioned outputs become 10 ways of 0–9. Subsequently, an address in which the input signal is a lower digit and the output signal of the pointer 30 is an upper digit is inputted to the ROM 31, and the data of 10 bits is obtained. The data of 10 bits represent 10 of 1-bit signal. Relation between the address (the upper digit and the lower digit are represented by respective decimal numbers) and data (10 of 1-bit signal) is shown in Table 3.

TABLE 3

| Lower digit = 0 | | Lower digit = 1 | | Lower digit = 2 | |
|---|---|---|---|---|---|
| Upper digit | Data | Upper digit | Data | Upper digit | Data |
| 0 | 0000000000 | 0 | 0000000001 | 0 | 0000000011 |
| 1 | 0000000000 | 1 | 0000000010 | 1 | 0000000110 |
| 2 | 0000000000 | 2 | 0000000100 | 2 | 0000001100 |
| 3 | 0000000000 | 3 | 0000001000 | 3 | 0000011000 |

TABLE 3-continued

| 4 | 0000000000 | 4 | 0000010000 | 4 | 0000110000 |
|---|---|---|---|---|---|
| 5 | 0000000000 | 5 | 0000100000 | 5 | 0001100000 |
| 6 | 0000000000 | 6 | 0001000000 | 6 | 0011000000 |
| 7 | 0000000000 | 7 | 0010000000 | 7 | 0110000000 |
| 8 | 0000000000 | 8 | 0100000000 | 8 | 1100000000 |
| 9 | 0000000000 | 9 | 1000000000 | 9 | 1000000001 |

| Lower digit = 3 | | Lower digit = 4 | | Lower digit = 5 | |
|---|---|---|---|---|---|
| Upper digit | Data | Upper digit | Data | Upper digit | Data |
| 0 | 0000000111 | 0 | 0000001111 | 0 | 0000011111 |
| 1 | 0000001110 | 1 | 0000011110 | 1 | 0000111110 |
| 2 | 0000011100 | 2 | 0000111100 | 2 | 0001111100 |
| 3 | 0000111000 | 3 | 0001111000 | 3 | 0011111000 |
| 4 | 0001110000 | 4 | 0011110000 | 4 | 0111110000 |
| 5 | 0011100000 | 5 | 0111100000 | 5 | 1111100000 |
| 6 | 0111000000 | 6 | 1111000000 | 6 | 1111000001 |
| 7 | 1110000000 | 7 | 1110000001 | 7 | 1110000011 |
| 8 | 1100000001 | 8 | 1100000011 | 8 | 1100000111 |
| 9 | 1000000011 | 9 | 1000000111 | 9 | 1000001111 |

| Lower digit = 6 | | Lower digit = 7 | | Lower digit = 8 | |
|---|---|---|---|---|---|
| Upper digit | Data | Upper digit | Data | Upper digit | Data |
| 0 | 0000111111 | 0 | 0001111111 | 0 | 0011111111 |
| 1 | 0001111110 | 1 | 0011111110 | 1 | 0111111110 |
| 2 | 0011111100 | 2 | 0111111100 | 2 | 1111111100 |
| 3 | 0111111000 | 3 | 1111111000 | 3 | 1111111001 |
| 4 | 1111110000 | 4 | 1111110001 | 4 | 1111110011 |
| 5 | 1111100001 | 5 | 1111100011 | 5 | 1111100111 |
| 6 | 1111000011 | 6 | 1111000111 | 6 | 1111001111 |
| 7 | 1110000111 | 7 | 1110001111 | 7 | 1110011111 |
| 8 | 1100001111 | 8 | 1100011111 | 8 | 1100111111 |
| 9 | 1000011111 | 9 | 1000111111 | 9 | 1001111111 |

| Lower digit = 9 | | Lower digit = 10 | |
|---|---|---|---|
| Upper digit | Data | Upper digit | Data |
| 0 | 0111111111 | 0 | 1111111111 |
| 1 | 1111111110 | 1 | 1111111111 |
| 2 | 1111111101 | 2 | 1111111111 |
| 3 | 1111111011 | 3 | 1111111111 |
| 4 | 1111110111 | 4 | 1111111111 |
| 5 | 1111101111 | 5 | 1111111111 |
| 6 | 1111011111 | 6 | 1111111111 |
| 7 | 1110111111 | 7 | 1111111111 |
| 8 | 1101111111 | 8 | 1111111111 |
| 9 | 1011111111 | 9 | 1111111111 |

The Table 3 is elucidated: the data of 10 bits is "1" only shown by the value of the address lower digit namely the input signal, and a sum total of each bit is made to be equal to the input signal. Moreover, it is shifted to the left as merely shown by the value of the address lower digit namely the output signal of the pointer 30, and an overflowed digit circulates so as to appear from the right. By defining the ROM 31 as shown in the Table 3, for example, the data is output as shown in Table 4.

TABLE 4

| Time | Input Lower digit address | Pointer 30 output Upper digit address | ROM 31 output (Data) |
|---|---|---|---|
| 1 | 5 | 0 | 0000011111 |
| 2 | 3 | 5 | 0011100000 |
| 3 | 1 | 8 | 0100000000 |
| 4 | 4 | 9 | 1000000111 |
| 5 | 8 | 3 | 1111111001 |

TABLE 4-continued

| Time | Input Lower digit address | Pointer 30 output Upper digit address | ROM 31 output (Data) |
|---|---|---|---|
| 6 | 7 | 1 | 0011111110 |
| 7 | 2 | 8 | 1100000000 |
| 8 | 6 | 0 | 0000111111 |
| 9 | 10 | 6 | 1111111111 |
| 10 | 9 | 6 | 1111011111 |
| 11 | 0 | 5 | 0000000000 |
| 12 | 3 | 5 | 0011100000 |
| . | . | . | . |
| . | . | . | . |
| . | . | . | . |

As is understood from the Table 4, "1" as merely shown by the value of the input signal is output so as to circulate in the data of 10 bits, and this shows that there is no correlation between the value of the input signal and a particular bit in the 10 bit data. For this reason, in the case that a relative error exists between the outputs of the 1-bit D/A converter array 13 to which 10 bit data are connected respectively, generation of distortion or noise in the signal band can be reduced.

Figure 4:
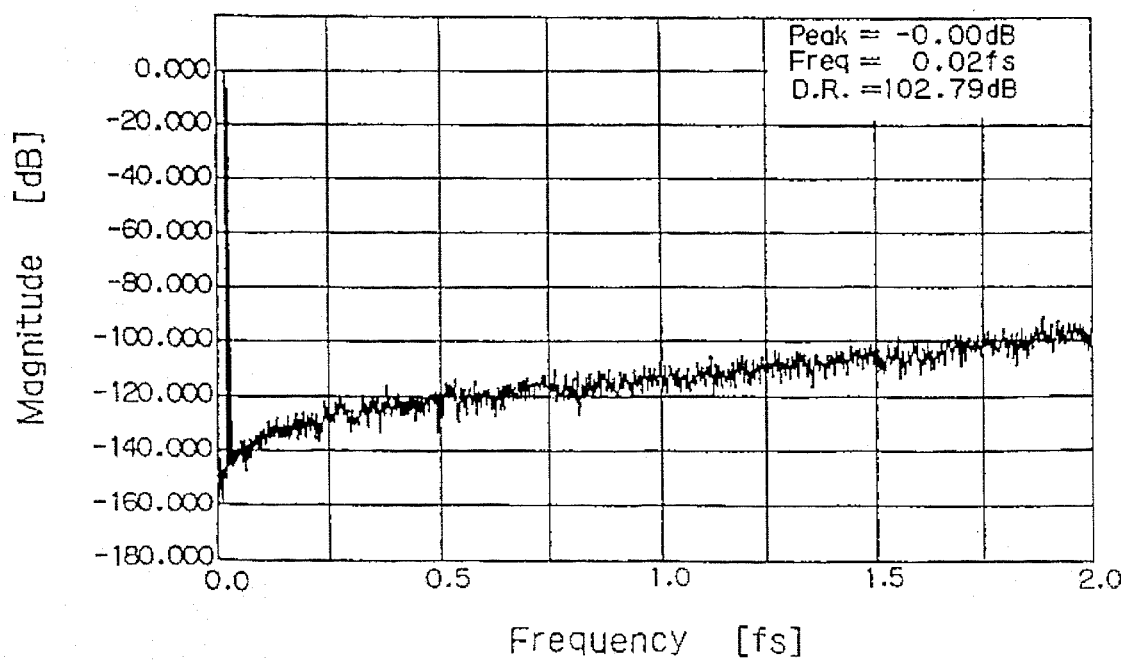
FIG. 4 is an output signal spectrum of the D/A conversion apparatus of FIG. 1.
Figure 26:
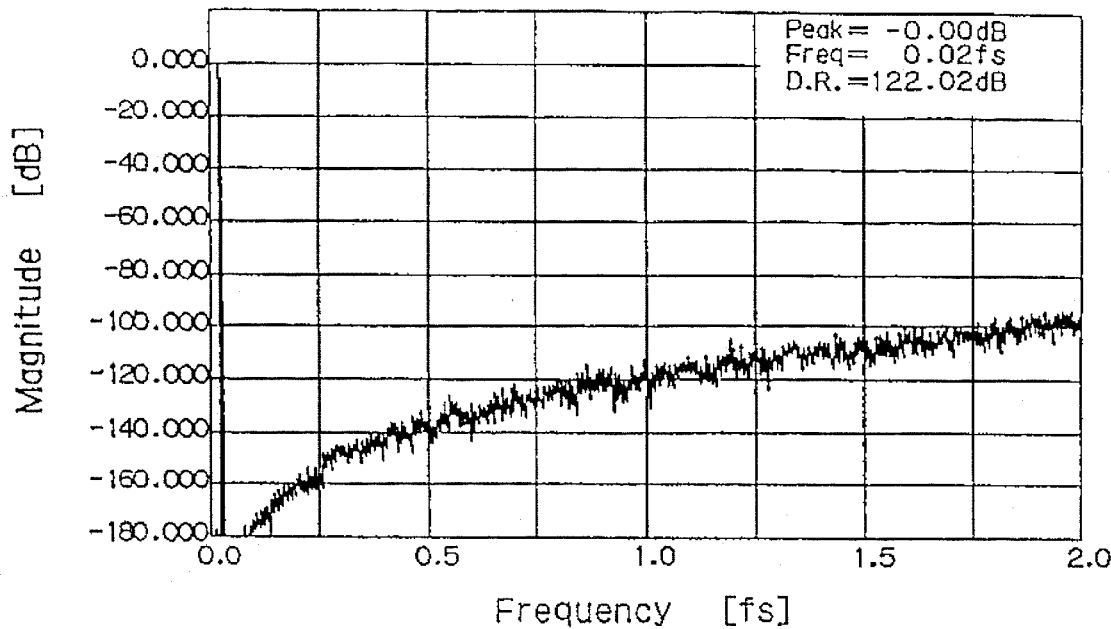
FIG. 26 is the output signal spectrum of the D/A conversion apparatus of FIG. 24.

In the D/A conversion apparatus of FIG. 1, as to the case that the outputs of the 1-bit D/A converter array 13 have 1% of relative error (the error uniformly distributes in the range of ±1%) as shown in the Table 5, for example, result derived by simulation on output spectrum in the same condition as FIG. 26 is shown in FIG. 4. For simplicity, where, the signals until 0–2 fs are shown.

TABLE 5

| Position of 1-bit D/A converter | Output value of 1-bit D/A converter | Relative error [%] |
|---|---|---|
| DAC-1 | 1.009 | 0.9 |
| DAC-2 | 1.007 | 0.7 |
| DAC-3 | 1.005 | 0.5 |
| DAC-4 | 1.003 | 0.3 |
| DAC-5 | 1.001 | 0.1 |
| DAC-6 | 0.999 | −0.1 |
| DAC-7 | 0.997 | −0.3 |
| DAC-8 | 0.995 | −0.5 |
| DAC-9 | 0.993 | −0.7 |
| DAC-10 | 0.991 | −0.9 |

Figure 5:
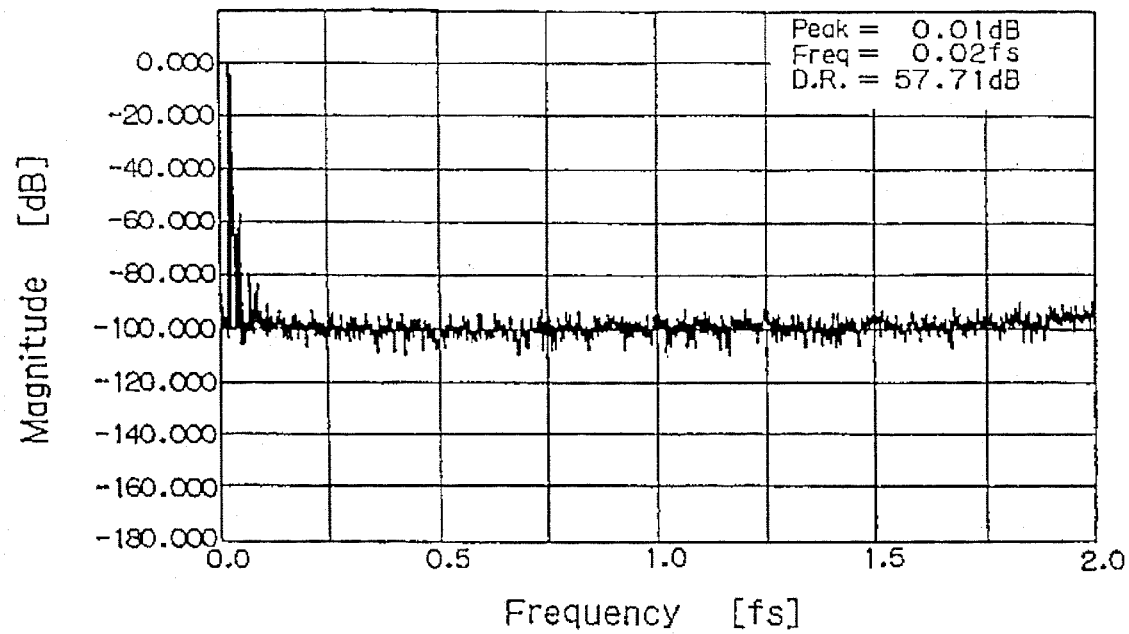
FIG. 5 is an output signal spectrum in the case that the output of a pointer 30 does not depend on an input and is fixed to 0 in the D/A conversion apparatus of FIG. 1.

As shown in FIG. 26, a dynamic range of 120 dB or more is obtained in the signal band of 0–fs/2 in the output from the NS 11, but the dynamic range is about 103 dB in FIG. 4, and it is found that deterioration of performance is slight in spite of existence of the relative error (a difference from average) reaching to 1% in the outputs of the 1-bit D/A converter array 13. On the contrary, in the case of the output in which the data does not circulate, for example, result derived by simulation on output signal spectrum in the case that the output of the pointer 30 does not depend on the input but is fixed to 0 is shown in FIG. 5. As seen in FIG. 5, it is recognized that noise increases in comparison with FIG. 4, and harmonic distortion is generated, and moreover the dynamic range is severely deteriorated such as about 58 dB.

Figure 6:
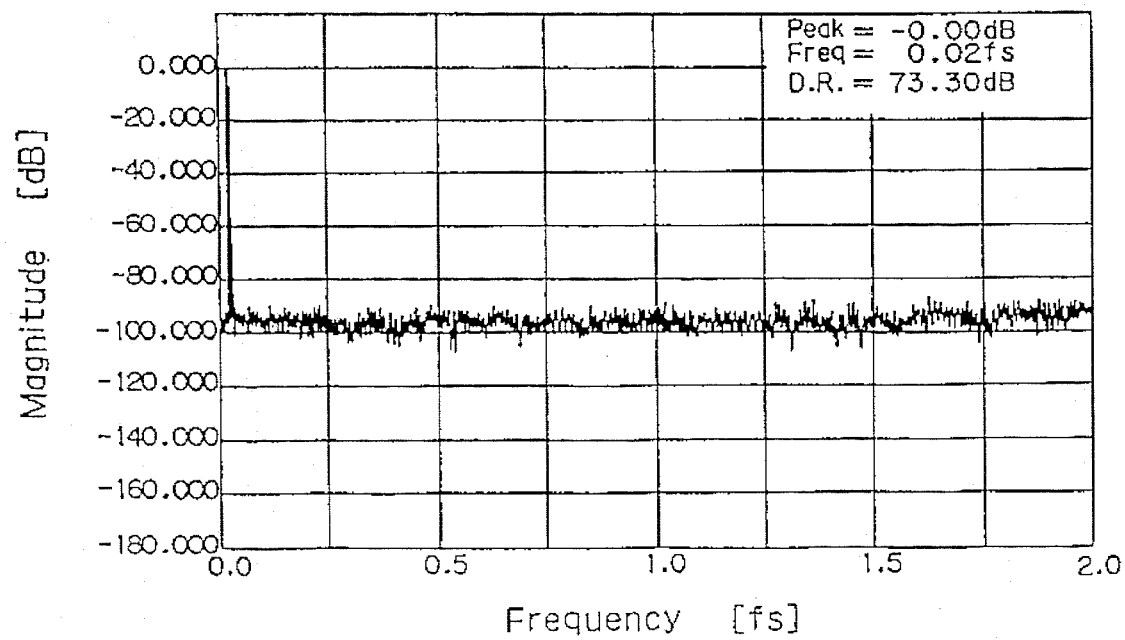
FIG. 6 is an output signal spectrum in the case that operation of the pointer 30 does not depend on the output of an NS 11 and is made to output repeatedly the signals of 0-9 in turn in the D/A conversion apparatus of FIG. 1.

Moreover, though it is here assumed that operation of the pointer 30 is to accumulate the signals (0–10) of 11 levels output from the NS 11 of FIG. 1 and to derive the remnant and output it, as other embodiment of the present invention, the operation of the pointer 30 does not depend on the output of the NS 11 but may be output repeatedly the signals of 0–9 in order. Result derived by simulation on output signal spectrum in this case is shown in FIG. 6. As seen in FIG. 6, though increases of noise is present in comparison with FIG. 26 or FIG. 4, the harmonic distortion generated in the case of FIG. 5 is not found, and moreover the dynamic range is improved in comparison with FIG. 5. Particularly in this method, the operation of the pointer 30 is limited output repeatedly the signals of 0–9 in order and a circuit scale of the pointer 30 may be reduced because accumulation and calculation of a remnant are not necessitated.

Subsequently, other embodiment of the present invention is elucidated.

Relation between an analog output in the D/A conversion circuit 15 of FIG. 2 and a relative error of the 1-bit D/A converter array (DAC 13) is elucidated. It is now assumed that the output of the DAC-1 is D1, the output of the DAC-2 is D2, . . . , the output of the DAC-m is Dm and an average output of each DAC is D, the relative error $\epsilon i$ ($i=1, 2, \ldots, m$) of each DAC has the relation of an equation (7):

$$\epsilon = D_i - D$$

$$\epsilon_1 + \epsilon_2 + \ldots + \epsilon_m = 0 \tag{7}$$

It is assumed that a probability of which the number of signal being "1" in the output of the DEC 12 of FIG. 1 is 1 is P1, a probability becoming 2 is P2, . . . a probability becoming m is Pm, an effective value $\epsilon rms$ of the relative error included in the analog output becomes an equation (8):

$$\begin{aligned}
\epsilon rms^2 &= P1 \cdot \sum_{i=1}^{m} \epsilon i^2 + P2 \cdot \sum_{i=1}^{m} (\epsilon i + \epsilon (i+1) \bmod 10)^2 + \\
&\quad P3 \cdot \sum_{i=1}^{m} (\epsilon i + \epsilon (i+1) \bmod 10 + \epsilon (i+2) \bmod 10)^2 + \ldots + \\
&\quad Pm \cdot \sum_{i=1}^{m} (\epsilon i + \epsilon (i+1) \bmod 10 + \ldots + \epsilon (i+m-1) \bmod 10)^2 \\
&= (P1 + Pm) \cdot \sum_{i=1}^{m} \epsilon i^2 + P2 \cdot \sum_{i=1}^{m} (\epsilon i + \epsilon (i+1) \bmod 10)^2 + \\
&\quad (P2 + P(m-1)) \cdot \sum_{i=1}^{m} (\epsilon i + \epsilon (i+1) \bmod 10)^2 + \\
&\quad (P3 + P(m-2)) \cdot \sum_{i=1}^{m} (\epsilon i + \ldots)^2 + \ldots
\end{aligned} \tag{8}$$

In the equation (8), a first term of the right side depends on the relative error of each DAC, and in order to decrease this term the relative error between each DAC must be decreased. However, the second term and thereafter of the right side is an error which is generated by the relative error between the DACs combined when the DAC of the number corresponding to the output of the DEC 12 is combined and output, and this term can be reduced by combination of the DACs. As is apparent from the equation (4), in order to decrease on and after the second term of the right side, the sum of the relative error of neighboring DACs is preferably decreased, and "for the purpose, it may be arranged so that the DAC having a relative error (a negative relative error with respect to a positive relative error, or the reverse thereof), which is contrary to the neighboring bits of the output signal array of the DEC 12, is allotted.

Figure 7:
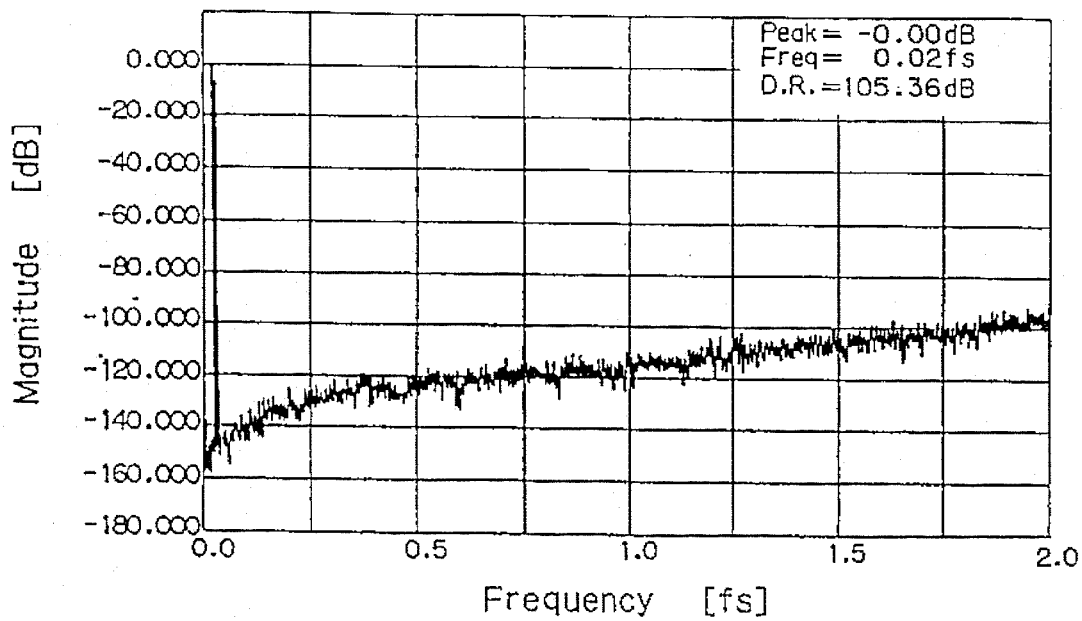
FIG. 7 is an output signal spectrum of the D/A conversion apparatus of FIG. 1 based on Table 6.

In the D/A conversion apparatus of FIG. 1, in the case that the output of the 1-bit D/A converter array 13 has 1% of relative error as shown in Table 6, for example, and in the case that the code of the relative error is contrary in the neighboring DACs (plus and minus are alternated), result derived by simulation on output signal spectrum in the same condition as FIG. 4 is shown in FIG. 7.

TABLE 6

| Position of 1-bit D/A converter | Output value of 1-bit D/A converter | Relative error [%] |
| --- | --- | --- |
| DAC-1 | 1.009 | 0.9 |
| DAC-2 | 0.993 | −0.7 |
| DAC-3 | 1.005 | 0.5 |
| DAC-4 | 0.997 | −0.3 |
| DAC-5 | 1.001 | 0.1 |
| DAC-6 | 0.999 | −0.1 |
| DAC-7 | 1.003 | 0.3 |
| DAC-8 | 0.995 | −0.5 |
| DAC-9 | 1.007 | 0.7 |
| DAC-10 | 0.991 | −0.9 |

As shown in FIG. 7, a dynamic range of 105 dB or more is obtained in the signal band of 0– fs/2, improvement of 2 dB or more than about 103 dB of dynamic range of FIG. 4 is understood.

Well, in the case of a general signal using 0– fs/2 as a signal band in the oversampling, the probability Pi (i=0, 1, . . . , 9) in the equation (8) becomes the largest at P5 namely at the vicinity of the center point of the output voltage. Namely, the arrangement for making the term of the P5 minimum can make maximum the dynamic range. For this purpose, now, when each 1-bit D/A converter of the DAC 13 are D1, D2, D3, D4, . . . , Dm-3, Dm-2, Dm-1 and Dm, in the order of the output levels, respectively, allotment of the 1-bit D/A converter may be arranged with respect to each bit of the output signal array of the DAC 12 in the order of D1, Dm-1, D3, Dm-3, . . . , D4, Dm-2, D2 and Dm. The output of the 1-bit D/A converter array 13 becomes as shown in Table 6 by complying with this arrangement.

Subsequently, further other embodiment of the present invention is elucidated.

Figure 8:
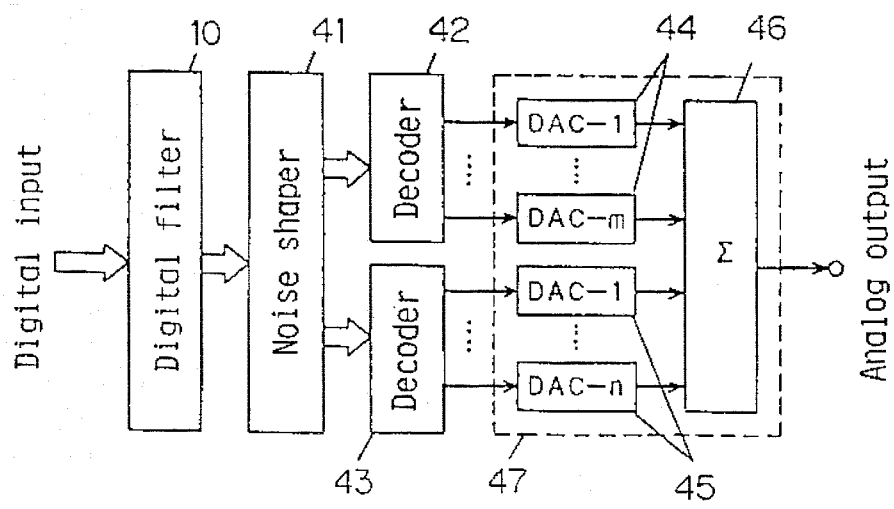
FIG. 8 is a block diagram representing other embodiment of the D/A conversion apparatus in accordance with the present invention.

FIG. 8 is a block diagram representing an embodiment of the D/A conversion apparatus in accordance with the present invention.

Figure 25:
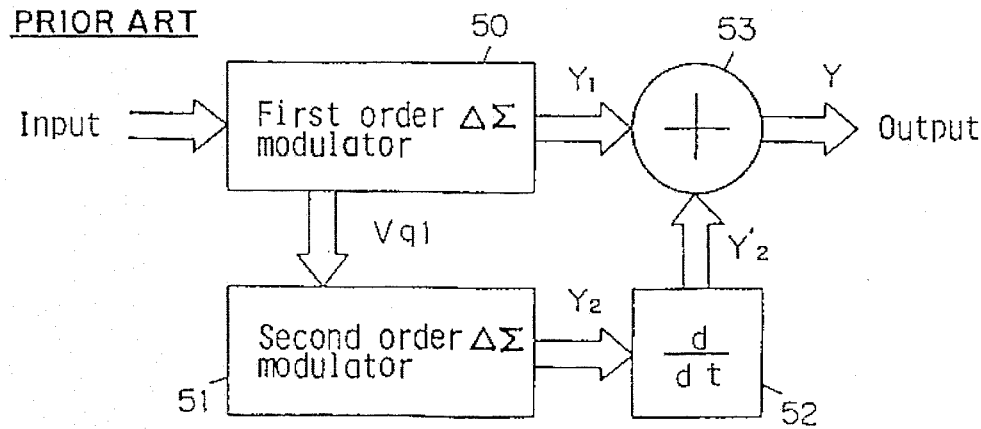
FIG. 25 is the block diagram representing one example of the noise shaper 11 of FIG. 24.

In FIG. 8, numeral 10 designates the digital filter (DF), which has the same configuration & function as those shown in FIG. 1. Numeral 41 designates a noise shaper (NS) of a multi-stage quantization type, and which has similar configuration to the NS 11 of FIG. 25, and is made to directly output the outputs Y1 and Y2' without addition as described hereinafter. Numerals 42, 43 designate decoders (DEC), and the DEC 42 outputs 1-bit signals of the number of m and the DEC 43 outputs 1-bit signals of the number of n in correspondence to the digital signal output from the NS 41, respectively. Numerals 44, 45 designate the 1-bit D/A converter group (DAC) in a series of the 1-bit D/A converter array; and all of these are composed of uniform 1-bit D/A converters of number of (m+n), from a first D/A converter (DAC-1) to a m-th D/A converter (DAC-m) for numeral 44, and from a first D/A converter (DAC-1) to an n-th D/A converter (DAC-n) for numeral 45. Numeral 46 designates an analog adder, and which totalizes analog signals of the number of (m+n) output from the DAC 44 and DAC 45, and output as an analog signal. Numeral 47 designates a D/A conversion circuit, and which are composed of the DACs 44, 45 and the analog adder 46. The D/A conversion apparatus of FIG. 8 is the one which, after making the digital input signal to a sampling frequency 64 fs, a signal Y1 of 7 (=p1) levels and a signal Y2' of 5 (=p2) levels by the DF 10 and the NS 41, makes the digital input signal into 1-bit signals of the number of m and the number of n by the DACs 42, 43, respectively, and further converts them to an analog signal by the D/A conversion circuit 47; and the apparatus is made a D/A conversion apparatus of so called oversampling type by which a digital signal is converted into an analog signal by a higher sampling frequency.

Figure 9:
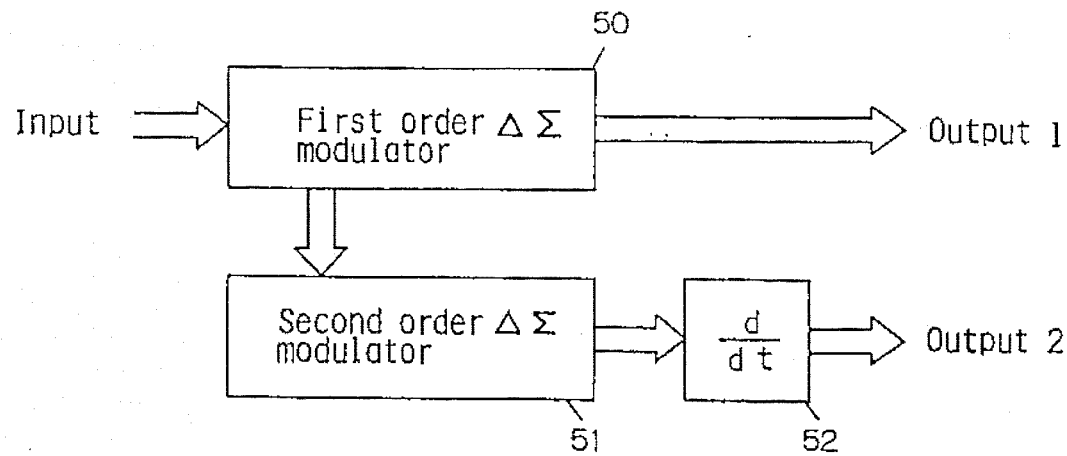
FIG. 9 is a block diagram representing an embodiment of a noise shaper 41 of FIG. 8.

Further detailed configuration of the NS 41 of FIG. 8 is shown in FIG. 9. As described above, the NS 41 of FIG. 8 has a similar configuration & function to the NS 11 of FIG. 25, and since the first order $\Delta\Sigma$ modulator 50, the second order $\Delta\Sigma$ modulator 51 and the differentiator 52 are the same ones, the elucidation is omitted. As a different point, in the NS 11 of FIG. 25, though the output Y1 of the first order $\Delta\Sigma$ modulator 50 and the output Y2' of the differentiator 52 are added by the adder 53 and to output, in the NS 41 of FIG. 9, the Y1 and the Y2' are output independently, respectively, as described hereafter the Y1 and Y2' are made to add by the D/A conversion circuit 47. Therefore, the adder 53 may be omitted in this method, and the circuit scale may be reduced. Incidentally, the output Y1 at this time has the output (−3–+3) of 7 (=p1) levels, and the output Y2' has the output (−2–+2) of 5 (=p2) levels.

Figure 10:
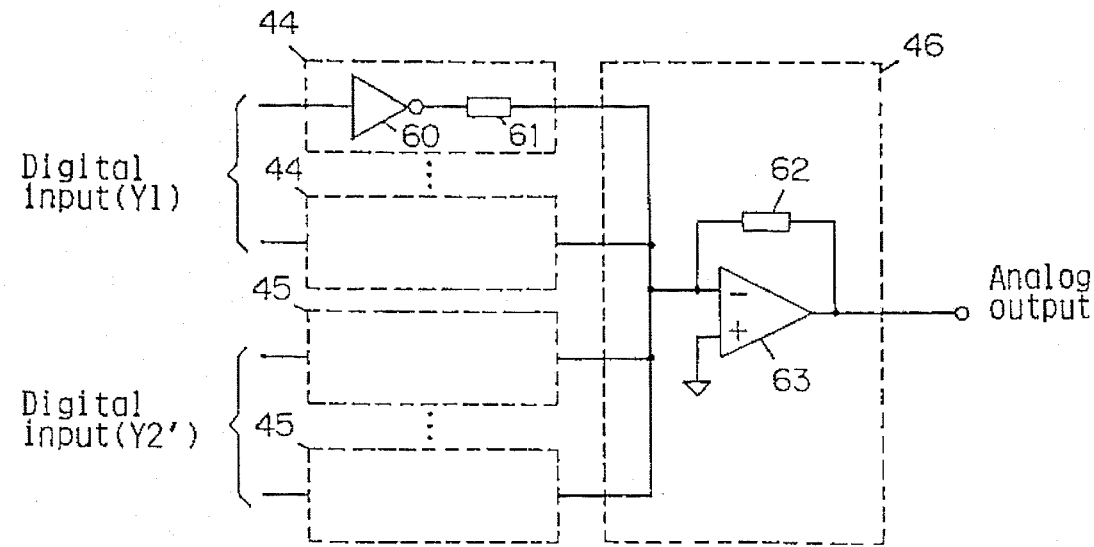
FIG. 10 is a circuitry representing an example of a D/A conversion circuit 47 of FIG. 8.

An example of the D/A conversion circuit 47 of FIG. 8 is shown in FIG. 10. In FIG. 10, numerals 44, 45 designate the 1-bit D/A converter group (DAC), numeral 46 designates the analog adder, which correspond to FIG. 8, respectively. Numeral 60 designates an inverter, which outputs the 1-bit input signal by inverting. Numerals 61, 62 designates resistors, numeral 63 designates an operational amplifier (operational amplifier). Operation of FIG. 10 is elucidated, first, the non-invert input terminal of the operational amplifier 63 is grounded, and the invert input terminal is a virtual grand point. Moreover, all of the 1-bit input signals are connected to the invert input terminal of the operational amplifier 63 through the inverters 60, the resistors 61, and moreover, is connected to the output terminal of the operational amplifier 63 through the resistor 62. Namely, a current addition circuit consisting of the resistors 61, 62 is formed. it is now assumed that a resistance value of the resistor 61 of the DAC-1 of the DAC 44 is R11, a resistance value of the resistor 61 of the DAC-2 is R12, . . . , a resistance value of the resistor 61 of the DAC-m is R1m, and a resistance value of the resistor 61 of the DAC-1 of the DAC 45 is R21, a resistance value of the resistor 61 of the DAC-2 is R22, . . . , a resistance value of the resistor 61 of the DAC-n is R2n, and a resistance value of the resistor 62 is Rf, an analog output voltage Eo is derived by equation (9):

$$Eo = Rf \cdot V \cdot \left( \frac{S11}{R11} + \frac{S12}{R12} + \ldots + \frac{S1m}{R1m} + \right. \quad (9)$$

$$\left. \frac{S21}{R21} + \frac{S22}{R22} + \ldots + \frac{S2n}{R2n} \right),$$

where,

V: inverter output voltage

Sij: inverter output logic (i=1, j=1, 2, ..., m) or (i=2, j=1, 2, ..., n)

$$Sij \begin{cases} 1: \text{when the inverter output is "1"} \\ 0: \text{when the inverter output is "0"}. \end{cases}$$

Here, since all of the DACs 44, 45 have uniform configuration, the resistance value of the resistor 61 is also $$R11=R12=\ldots=R1m=R21=R22=\ldots R2n,$$

and the output of the operational amplifier 63, namely the analog output, is rendered the one to output a voltage value proportional to the number of the signals which are "0" (namely the output of the inverter 30 is "1") among the 1-bit input signals.

In an actual circuit, it is impossible to fabricate completely uniform resistor 61 of the DACs 44 and 45, and some relative error exists. In this case, as is obvious from the equation (9), a voltage value depending on a position as well as the number of the signals which are "0" in the 1-bit input signals is output.

Since the configuration operation of the DECs 42, 43 of FIG. 8 are similar to the DEC 12 of FIG. 1, elucidation is made by using FIG. 3 as a block diagram. In FIG. 3, numeral 30 designates the pointer, and a remnant of the accumulation value of the input signal is output. Numeral 31 designates a ROM (read only memory), which outputs data of m-bits or n-bits corresponding to an address in which the input signal is made to lower digit, and the output of the pointer 30 is made to an upper digit. It is here assumed that m=6 (=p1−1), n=4 (=p2−1). Difference of the DECs 42 and 43 depends on the difference of m and n, where only the DEC 42 is elucidated because principle of operation is fundamentally identical. Incidentally, though the DEC 42 has input signals Y1 (−3−+3) of 7 levels, for simplicity the elucidation is made by adding 3 to the signal to render (0−6).

Operation of FIG. 3 is elucidated, first the pointer 30 accumulates the signals Y1 (0−6) of 7 levels output from the NS 41 of FIG. 8, and derives a remnant of 6 and outputs. Therefore, the above-mentioned output becomes 6 ways (0−5). Subsequently, an address, in which the input signal is made to the lower digit and the output signal of the pointer 30 is made to the upper digit, is inputted to the ROM 31; and the data of 6 bits is obtained. This data of 6 bits represents 6 1-bit signals. Relation of the address (decimal number) and the data (6 1-bit signals) at this time is shown in Table 7.

The Table 7 is elucidated; the 6-bit data is made to "1" by the extent shown by the address lower digit namely the value of the input signal; and the sum total of each bit is rendered equal to the input signal. Moreover, shifting to the left is made by the extent shown by the address lower digit namely the value of the output signal of the pointer 30, and circulates so that overflowed digit appears from the right. By defining the ROM 31 as in Table 7, for example, the data is output as in Table 8.

TABLE 7

| Lower digit = 0 | | Lower digit = 1 | | Lower digit = 2 | |
|---|---|---|---|---|---|
| Upper digit | Data | Upper digit | Data | Upper digit | Data |
| 0 | 000000 | 0 | 000001 | 0 | 000011 |
| 1 | 000000 | 1 | 000010 | 1 | 000110 |
| 2 | 000000 | 2 | 000100 | 2 | 001100 |
| 3 | 000000 | 3 | 001000 | 3 | 011000 |
| 4 | 000000 | 4 | 010000 | 4 | 110000 |
| 5 | 000000 | 5 | 100000 | 5 | 100001 |

| Lower digit = 3 | | Lower digit = 4 | | Lower digit = 5 | |
|---|---|---|---|---|---|
| Upper digit | Data | Upper digit | Data | Upper digit | Data |
| 0 | 000111 | 0 | 001111 | 0 | 011111 |
| 1 | 001110 | 1 | 011110 | 1 | 111110 |
| 2 | 011100 | 2 | 111100 | 2 | 111101 |
| 3 | 111000 | 3 | 111001 | 3 | 111011 |
| 4 | 110001 | 4 | 110011 | 4 | 110111 |
| 5 | 100011 | 5 | 100111 | 5 | 101111 |

| Lower digit = 6 | |
|---|---|
| Upper digit | Data |
| 0 | 111111 |
| 1 | 111111 |
| 2 | 111111 |
| 3 | 111111 |
| 4 | 111111 |
| 5 | 111111 |

TABLE 8

| Time | Input Lower digit address | Pointer 30 output Upper digit address | ROM 31 output (Data) |
|---|---|---|---|
| 1 | 5 | 0 | 011111 |
| 2 | 3 | 5 | 100011 |
| 3 | 1 | 2 | 000100 |
| 4 | 4 | 3 | 111001 |
| 5 | 2 | 1 | 000110 |
| 6 | 0 | 3 | 000000 |
| 7 | 2 | 3 | 011000 |
| 8 | 5 | 5 | 101111 |
| 9 | 1 | 4 | 010000 |
| 10 | 6 | 5 | 111111 |
| 11 | 2 | 5 | 100001 |
| . | . | . | . |
| . | . | . | . |
| . | . | . | . |

As is understood from Table 8, "1" by the extent shown by the value of the input signal is output so as to circulate the 6-bit data, and this shows that correlation of the value of the input signal and a particular bit in the 6-bit data is absent. For this reason, even in the case that a relative error exist between the outputs of the respective 1-bit D/A converters of the DACs 44 to which the 6-bit data are connected, respectively, generation of distortion or noise in the signal band can be reduced.

As mentioned above, though the DEC 42 is elucidated, the DEC 43 is basically identical thereto when the difference by which the input Y2' is 5 levels (−2−+2) and the output is 4 bits is considered.

Figure 11:
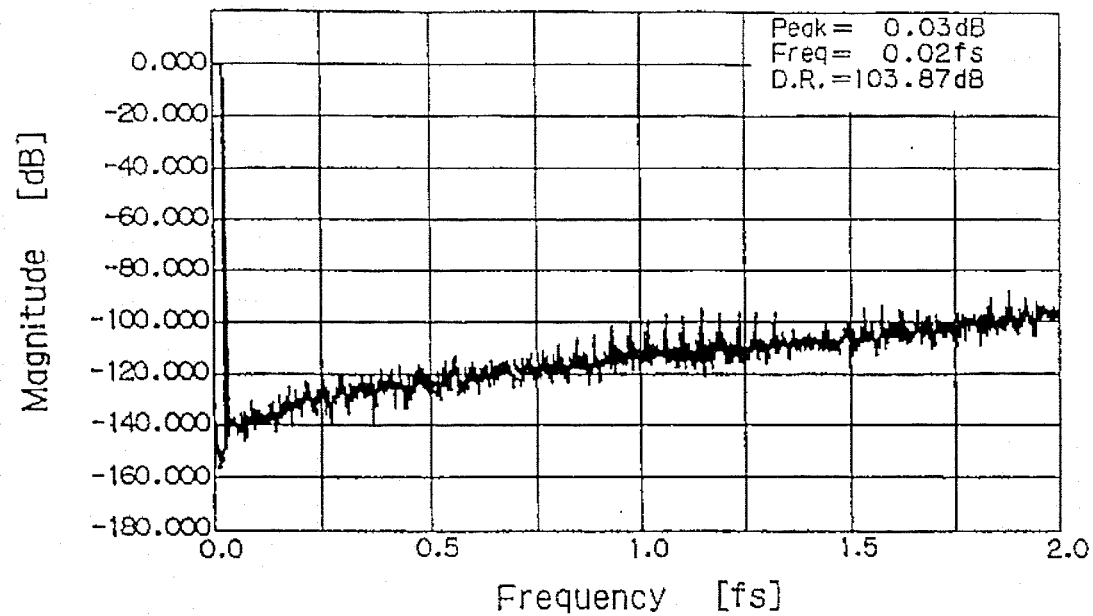
FIG. 11 is an output signal spectrum of the D/A conversion apparatus of FIG. 8 based on Table 9.

In the D/A conversion apparatus of FIG. 8, FIG. 11 shows result derived by simulation on output signal spectrum in the case that the sampling frequency (FS) is 64 fs, the input signal frequency is about 0.02 fs, the input signal level is 0 dB, and the outputs of the DACs 14, 15 have the relative error (the error distributes uniformly in the range of ±1%) of 1% as shown in Table 9, for example.

TABLE 9

| Position of 1-bit D/A converter | | Output value of 1-bit D/A converter | Relative error [%] |
|---|---|---|---|
| DAC 14 | DAC-1 | 1.009 | 0.9 |
| | DAC-2 | 1.007 | 0.7 |
| | DAC-3 | 1.005 | 0.5 |
| | DAC-4 | 1.003 | 0.3 |
| | DAC-5 | 1.001 | 0.1 |
| | DAC-6 | 0.999 | 0.1 |
| DAC 15 | DAC-1 | 0.997 | −0.3 |
| | DAC-2 | 0.995 | −0.5 |
| | DAC-3 | 0.993 | −0.7 |
| | DAC-4 | 0.991 | −0.9 |

As shown in FIG. 26, though the dynamic range of 120 dB or more is obtained in the signal band of 0–fs/2 in the output from the NS 1, in FIG. 11 the dynamic range is about 104 dB; and it is understood that the deterioration of performance is small in spite of presence of the relative error reaching 1% in the outputs of the DACs 44, 45.

Incidentally, if each 1-bit D/A converter of the 1-bit D/A converter array composed of the DACs 44, 45 are arranged in the order of the output level and allotment is made in the order of the DACs, 44, 45 as the Table 9 for example, the relative error of the 1-bit D/A converter group in each DAC may be equivalently reduced, and generation of the noise may be reduced. Namely, in the case of Table 9 for example, though the relative error totalized the DACs 44, 45 is 1%, the relative error is 0.6% only with the DAC 44, and is 0.4% only with the DAC 45.

Moreover, in the case that the NS 41 of FIG. 8 is two stage configuration as shown in FIG. 9, if arrangement of the DACs 44, 45 is inverted with each other the order of the output level of each 1-bit D/A converter as in Table 10, generation of the above-mentioned noise is further may be reduced, because the probability of making the phases of the noises by the relative error of the 1-bit D/A converter group in each DAC mutually inverse increases and the case canceling with each other increases.

TABLE 10

| Position of 1-bit D/A converter | | Output value of 1-bit D/A converter | Relative error [%] |
|---|---|---|---|
| DAC 14 | DAC-1 | 1.009 | 0.9 |
| | DAC-2 | 1.007 | 0.7 |
| | DAC-3 | 1.005 | 0.5 |
| | DAC-4 | 1.003 | 0.3 |
| | DAC-5 | 1.001 | 0.1 |
| | DAC-6 | 0.999 | −0.1 |
| DAC 15 | DAC-1 | 0.991 | −0.9 |
| | DAC-2 | 0.993 | −0.7 |
| | DAC-3 | 0.995 | −0.5 |
| | DAC-4 | 0.997 | −0.3 |

Figure 12:
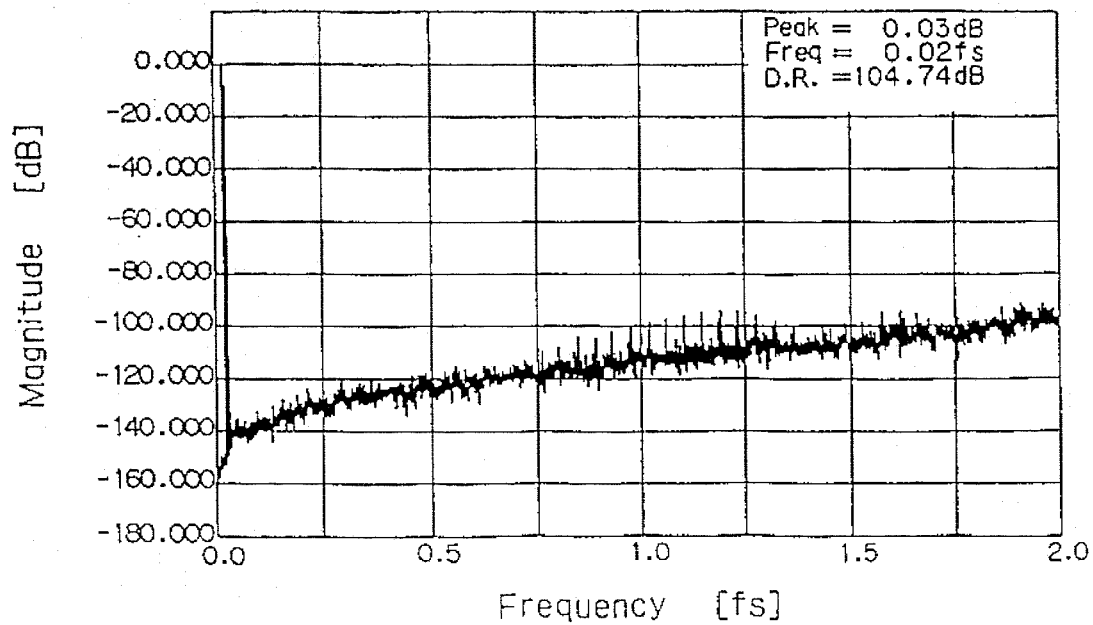
FIG. 12 is an output signal spectrum of the D/A conversion apparatus of FIG. 8 based on Table 10.

In the D/A conversion apparatus of FIG. 8, result derived by simulation on output signal spectrum in the case that the sampling frequency (FS) is 64 fs, the input signal frequency is about 0.02 fs, the input signal level is 0 dB and the outputs of the DACs 44, 45 are shown in Table 10 is shown in FIG. 12. As shown in FIG. 12, the dynamic range is about 105 dB, and the noise is lower than the case of FIG. 11 by about 1 dB.

Moreover, if each 1-bit D/A converter of the 1-bit D/A converter array composed of the DACs 44, 45 is arranged in the order of the output level, and the DAC 44 is allotted to both end parts and the DAC 45 is allotted to the center part as in Table 1 for example, the difference of an average output level of each DAC may be decreased, and because cancel of the term of Vq1 in the equation (2) and the equation (4) by addition of the outputs Y1 and Y2' of the NS 41 is accurately realized, generation of the noise may be decreased.

TABLE 11

| Position of 1-bit D/A converter | | Output value of 1-bit D/A converter | Difference from average (error) [%] |
|---|---|---|---|
| DAC 14 | DAC-1 | 1.009 | 0.9 |
| | DAC-2 | 1.007 | 0.7 |
| | DAC-3 | 1.005 | 0.5 |
| | DAC-4 | 0.995 | −0.5 |
| | DAC-5 | 0.993 | −0.7 |
| | DAC-6 | 0.991 | −0.9 |
| DAC 15 | DAC-1 | 0.997 | 0.3 |
| | DAC-2 | 0.999 | 0.1 |
| | DAC-3 | 1.001 | −0.1 |
| | DAC-4 | 1.003 | −0.3 |

Figure 13:
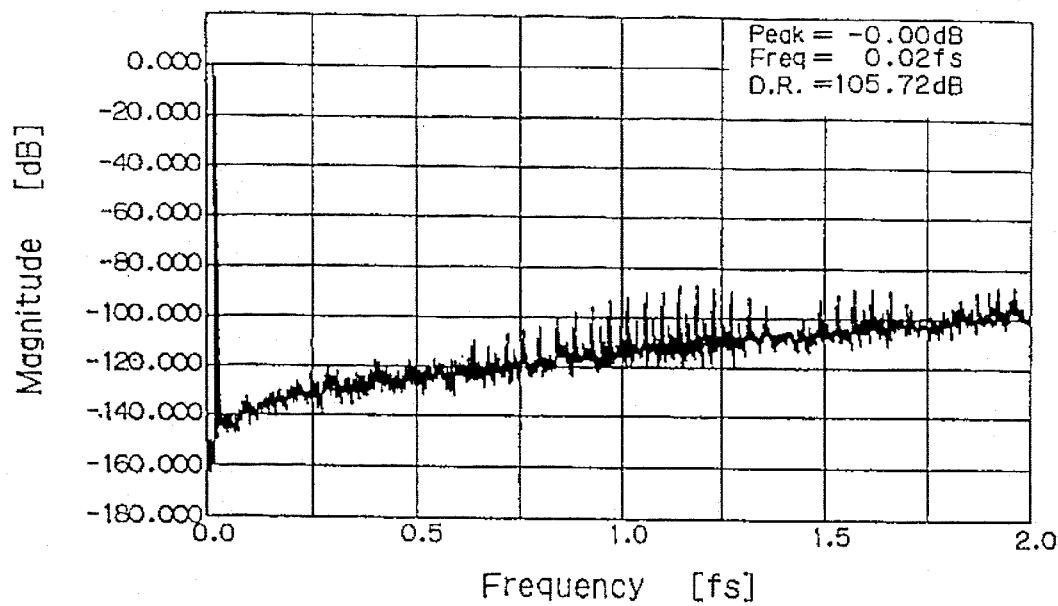
FIG. 13 is an output signal spectrum of the D/A conversion apparatus of FIG. 8 based on Table 11.

In the D/A conversion apparatus of FIG. 8, result derived by simulation on output signal spectrum in the case that the sampling frequency (FS) is 64 fs, the input signal frequency is about 0.02 fs, and the input signal level is 0 dB and the outputs of the DACs 44, 45 are made as shown in Table 11 is shown in FIG. 13. As shown in FIG. 13, the dynamic range is about 106 dB, and the noise is lower than the case of FIG. 11 by about 2 dB.

Moreover, in this case, in the case that the NS 11 is the two stage configuration as shown in FIG. 9, if the arrangement of the DACs 44, 45 is made inverse with each other in the order of the output level of each 1-bit D/A converter as shown in the Table 12, generation of noise may be reduced in a similar manner.

Figure 14:
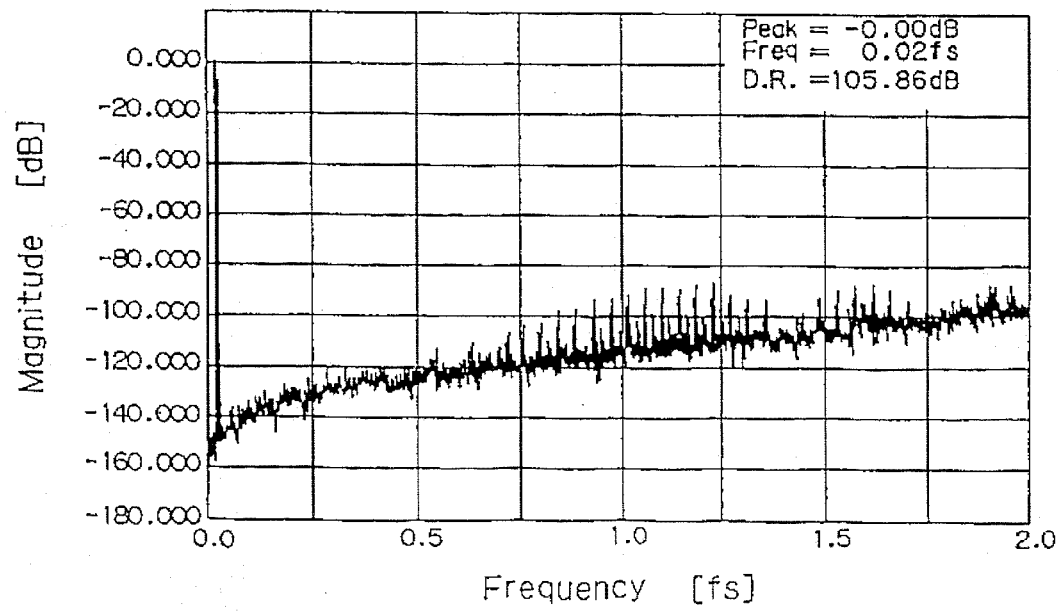
FIG. 14 is an output signal spectrum of the D/A conversion apparatus of FIG. 8 based on Table 12.

In the D/A conversion apparatus of FIG. 8, result derived by simulation on output signal spectrum in the case that the sampling frequency (FS) is 64 fs, the input signal frequency is about 0.02 fs, the input signal level is 0 dB and the outputs of the DACs 44, 45 are made as shown in Table 12 is shown in FIG. 14. As shown in FIG. 14, the dynamic range is about 106 dB, and the noise is lower than the case of FIG. 11 by about 2 dB.

TABLE 12

| Position of 1-bit D/A converter | | Output value of 1-bit D/A converter | Difference from average (error) [%] |
|---|---|---|---|
| DAC 14 | DAC-1 | 1.009 | 0.9 |
| | DAC-2 | 1.007 | 0.7 |
| | DAC-3 | 1.005 | 0.5 |
| | DAC-4 | 0.995 | −0.5 |
| | DAC-5 | 0.993 | −0.7 |
| | DAC-6 | 0.991 | −0.9 |
| DAC 15 | DAC-1 | 0.997 | −0.3 |
| | DAC-2 | 0.999 | −0.1 |
| | DAC-3 | 1.001 | 0.1 |
| | DAC-4 | 1.003 | 0.3 |

The D/A conversion apparatus is configurated as described above. Although the NS 11 and the NS 41 represented by the equation (1) are used here, it is of cause that one functioning as the noise shaper is usable even if it has a different order or characteristic. Moreover, the configuration of the DAC 12 shown in FIG. 3 or the ROM data or the like of the Table 1 is an example for description, and of cause it is not limited to this. Moreover, although it is described in the case that the output bit number of m of the DEC 12 (namely the number of m of 1-bit D/A converter 13) are (p−1) with respect to the outputs of p ways of the NS 11, respectively, m may be the number which is larger than this in accordance with the circuit configuration or the like because these are the minimum cases. It is similar in the output bit number of m of the DEC 42 (the number of m of the DAC 44) with respect to the output Y1 of p1 ways of the NS 41, the output bit number of n of the DEC 43 (the number of n of the DAC 45).

Subsequently, further embodiment of the present invention is elucidated.

Figure 15:
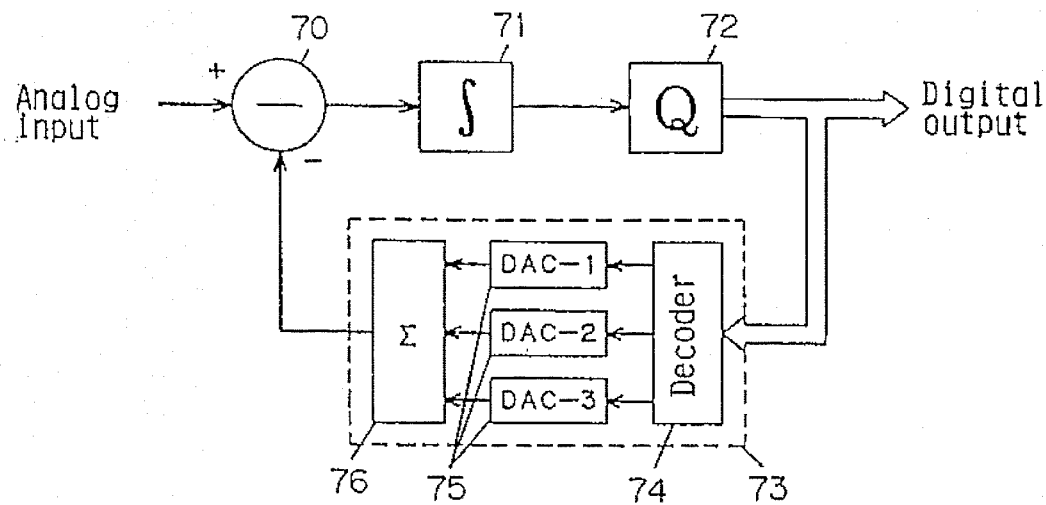
FIG. 15 is a block diagram representing an embodiment of the A/D conversion apparatus in accordance with the present invention.

FIG. 15 is a block diagram representing an embodiment of the A/D conversion apparatus in accordance with the present invention. In FIG. 15, numeral 70 designates a subtracter, numeral 71 designates an integrator and numeral 72 designates a quantizer, and each has the same configuration & function as that shown in FIG. 27. Numeral 73 designates the D/A converter, and which converts the output of the quantizer 72 to analog signal. The output of the D/A converter 73 is inputted to a subtraction terminal of the subtracter 70.

Numeral 74 designates a decoder, which outputs three (=p−1) 1-bit signals in correspondence to the digital signal output from the quantizer 72. Numeral 75 designates an 1-bit D/A converter array, which is comprised of three uniform (=p−1) 1-bit D/A converters from a first D/A converter (DAC-1) to a third D/A converter (DAC-3). Numeral 76 designates an analog adder, which totalizes three analog signals output from the 1-bit D/A converter array 75, and outputs as an analog signal.

Figure 27:
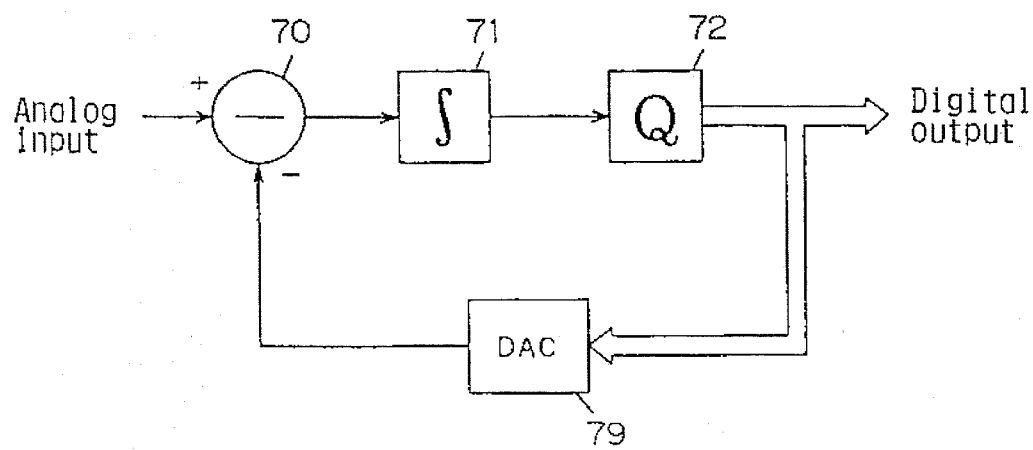
FIG. 27 is the block diagram representing an example of the conventional A/D conversion apparatus.

The A/D conversion apparatus of FIG. 15 is known as a noise shaping type A/D converter of first order characteristic, and an output Y with respect to an input X is represented by the equation (5) in a manner similar to FIG. 27.

Figure 16:
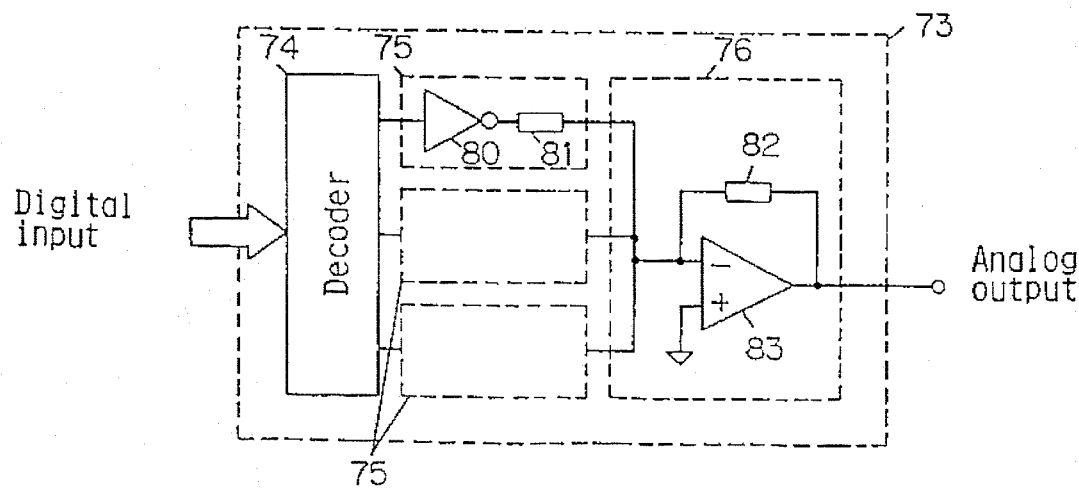
FIG. 16 is a circuitry representing an example of a D/A conversion circuit 73 of FIG. 15.

An example of a concrete circuit of the D/A converter 73 of FIG. 15 is shown in FIG. 16. In FIG. 16, the D/A converter 73, the decoder 74, the 1-bit D/A converter array 75 and the analog adder 76 correspond to FIG. 15, respectively. Numeral 80 designates an inverter, and which outputs the 1-bit input signal by inverting. Numerals 81, 82 designate resistors, numeral 83 designates an operational amplifier (operational amplifier). Operation of FIG. 16 is elucidated, first the noninvert input terminal of the operational amplifier 83 is grounded, and the invert input terminal is a virtual ground point. Moreover, all of the 1-bit input signals are connected to the invert input terminal of the operational amplifier 80 through the inverters 80, the resistors 81, and furthermore, are connected to the output terminal of the operational amplifier 23 (sic) through the resistor 82. Namely, a current addition circuit is composed of the resistors 81, 82. It is now assumed that the resistance value of the resistor 81 of the DAC-1 is R1, the resistance value of the resistor 81 of the DAC-2 is R2, the resistance value of the resistor 81 of the DAC-3 is R3 and the resistance value of the resistor 82 is Rf, an analog output voltage Eo is derived by an equation (10):

$$Eo = Rf \cdot V \cdot \left( \frac{S1}{R1} + \frac{S2}{R2} + \frac{S3}{R3} \right), \quad (10)$$

where,

V: inverter output voltage

Si: inverter output logic (i=1, 2, 3)

$$Si = \begin{cases} 1: \text{when the inverter output is "1"} \\ 0: \text{when the inverter output is "0"}. \end{cases}$$

Here, since all of the 1-bit D/A converters 75 are uniformly configurated, the resistance value of the resistor 81 is also R1=R2=R3, and the output of the operational amplifier 83 namely the analog output is made to output a voltage value which is proportional to the number of the signal being "0" (namely the output of the inverter 20 is "1") in the 1-bit signal output from the decoder 74.

In the actual circuit, it is impossible to fabricate the resistors 81 of the 1-bit D/A converter 75 with perfect uniformity, and there is some relative error. In this case, as is apparent from the equation (10), the voltage value which not only depend on the number of the signal being "0" of the output signals of the decoder 74 but also depends on the position is output.

Since the configuration & operation of the DEC 74 of FIG. 15 is similar to the DEC 12 of FIG. 1, elucidation is made by using FIG. 3 as a block diagram. An example of the decoder 74 of FIG. 15 is shown in FIG. 3. In FIG. 3, numeral 30 designates a pointer, which outputs a remnant of an accumulation value of the input signal. Numeral 31 designates a ROM (read only memory) which outputs data of 3 bits in correspondence to an address in which the input signal is a lower digit, the output of the pointer 30 is an upper digit.

Operation of FIG. 3 is elucidated; first the pointer 30 accumulates the input signal namely the signals of 2 bits ("00"–"11") output from the quantizer 72 of FIG. 15, and derives a remnant of 3 and output. Therefore, the above-mentioned output becomes three ways of 0–2. Subsequently, an address in which the input signal is the lower digit and the output signal of the pointer 30 is an upper digit is inputted to the ROM 31, and the data of 3 bits is obtained. The data of 3 bits represents three of the 1-bit signals. Relation between the address (decimal number) and the data (binary number) is shown in Table 13.

TABLE 13

| Lower digit = 0 | | Lower digit = 1 | |
|---|---|---|---|
| Upper digit | Data | Upper digit | Data |
| 0 | 000 | 0 | 001 |
| 1 | 000 | 1 | 010 |
| 2 | 000 | 2 | 100 |

| Lower digit = 2 | | Lower digit = 3 | |
|---|---|---|---|
| Upper digit | Data | Upper digit | Data |
| 0 | 011 | 0 | 111 |
| 1 | 110 | 1 | 111 |
| 2 | 101 | 2 | 111 |

The Table 13 is elucidated; the 3 bit data becomes "1" by the number shown by the value of the address lower digit namely the input signal, and the sum total of each bit is made to equal to the input signal. Moreover, shifting is made to the left by the value of the address lower digit namely the output signal of the pointer 30, and circulation is made so that the overflowed digit appears from the right. By defining the ROM 31 as the Table 13, the data is output as Table 14, for example:

TABLE 14

| Time | Input signal (Lower digit of address) | Output signal of pointer 30 (Upper digit of address) | Output signal of ROM 31 (Date) |
|---|---|---|---|
| 1 | 0 | 0 | 000 |
| 2 | 1 | 0 | 001 |
| 3 | 1 | 1 | 010 |

TABLE 14-continued

| Time | Input signal (Lower digit of address) | Output signal of pointer 30 (Upper digit of address) | Output signal of ROM 31 (Date) |
|---|---|---|---|
| 4 | 1 | 2 | 100 |
| 5 | 3 | 0 | 111 |
| 6 | 2 | 0 | 011 |
| 7 | 1 | 2 | 100 |
| 8 | 2 | 0 | 011 |
| 9 | 2 | 2 | 101 |
| . | . | . | . |
| . | . | . | . |
| . | . | . | . |

As is apparent from the Table 14, "1" by the extent shown by the value of the input signal is output so as to circulate the 3 bit data, and this shows that there is no correlation between the value of the input signal and a specified bit in the 3 bit data. Therefore, in the case that a relative error exists in the output of the 1-bit D/A converter 15 to which the 3 bits data are connected respectively, generation of distortion or noise in the signal band may be decreased.

Figure 17:
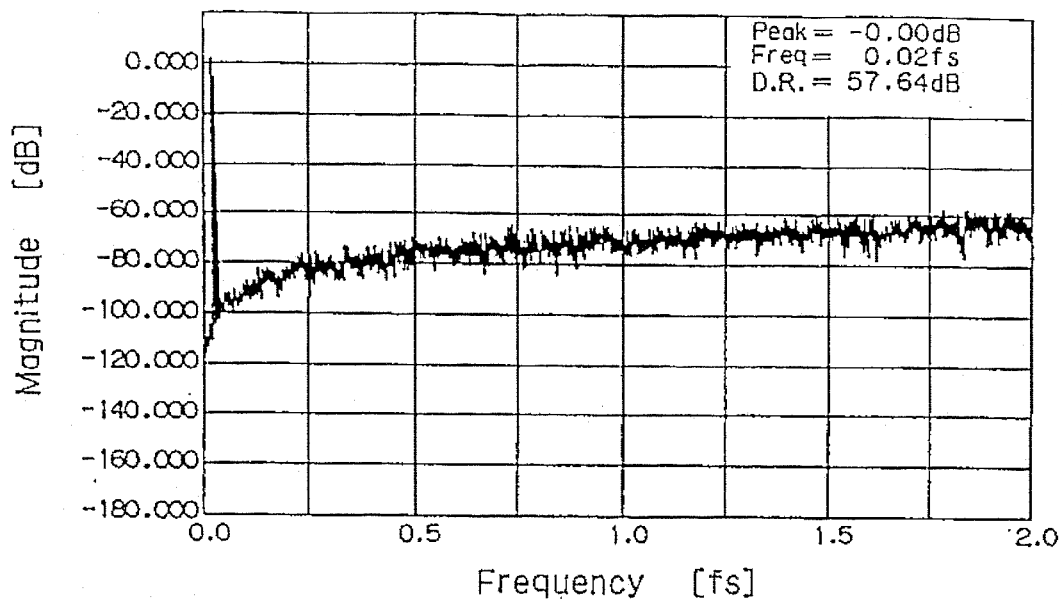
FIG. 17 is an output signal spectrum of the A/D conversion apparatus of FIG. 15.

In the A/D conversion apparatus of FIG. 15, result derived by simulation on output signal spectrum in the case that the sampling frequency (FS) is 64 fs, the input signal frequency is about 0.02 fs, the input signal level is 0 dB and the output of the 1-bit D/A converter array 15 has 3% of relative error as shown in Table 15 for example is shown in FIG. 17. Here, the signals until 0–2 fs are shown for simplicity.

Figure 28:
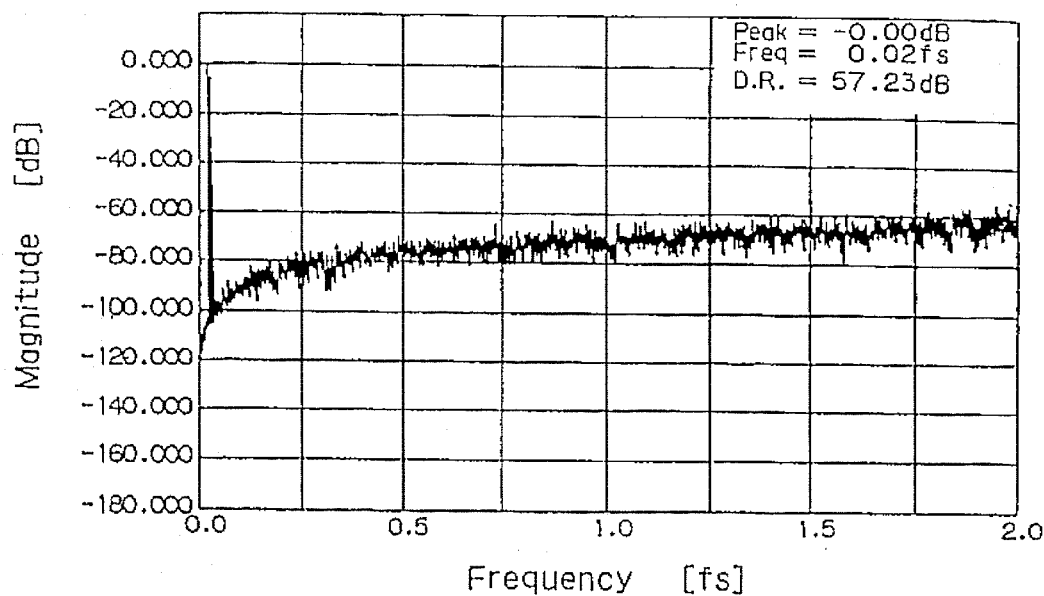
FIG. 28 is the output signal spectrum of the A/D conversion apparatus of FIG. 27.
Figure 29:
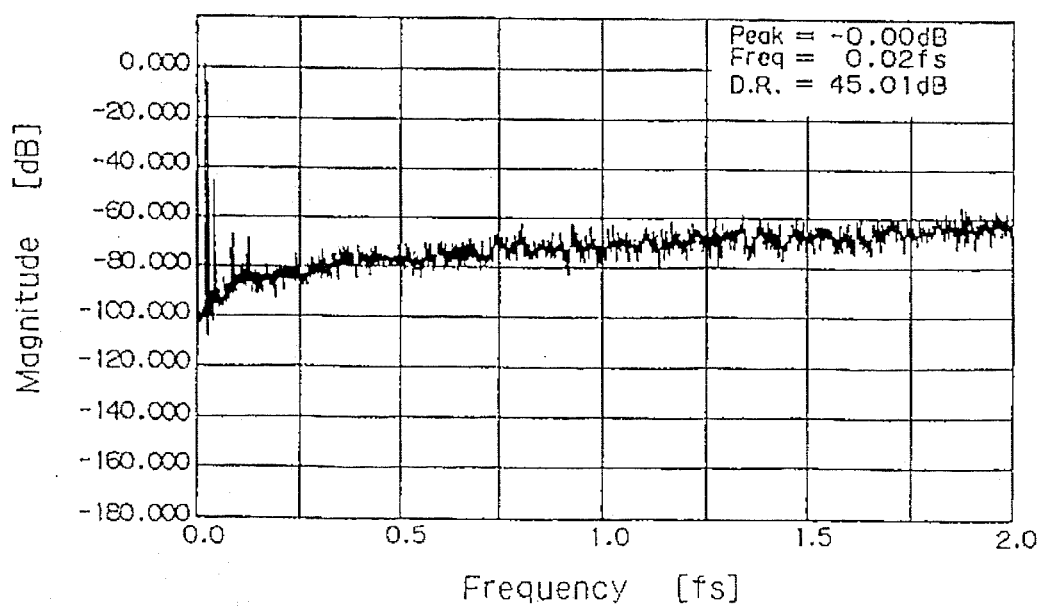
FIG. 29 is the output signal spectrum of the A/D conversion apparatus of FIG. 27 based on Table 2.

As shown in FIG. 28, in the case that the D/A converter 13 is ideal (no error), about 57 dB of dynamic range is obtained in the signal band of 0–fs/2, but the dynamic range is approximately identical in FIG. 17, and it is understood that the similar ability is obtainable in spite of existence of the relative error reaching 3% in the output of the 1-bit D/A converter array 15. On the contrary, in the case of the output in which the data does not circulate, for example in the case that the output of the pointer 30 does not depend on the input but is fixed to 0, the output of the D/A converter 13 is equivalent to the Table 2, and at this time a large harmonic distortion is generated in comparison with FIG. 17 as shown in FIG. 29, and moreover, the dynamic range is greatly deteriorated.

TABLE 15

| 1-bit data position of ROM 31 output signal | Output value of 1-bit D/A converter |
|---|---|
| 0 | 1.02 |
| 1 | 0.98 |
| 2 | 1.00 |

Figure 18:
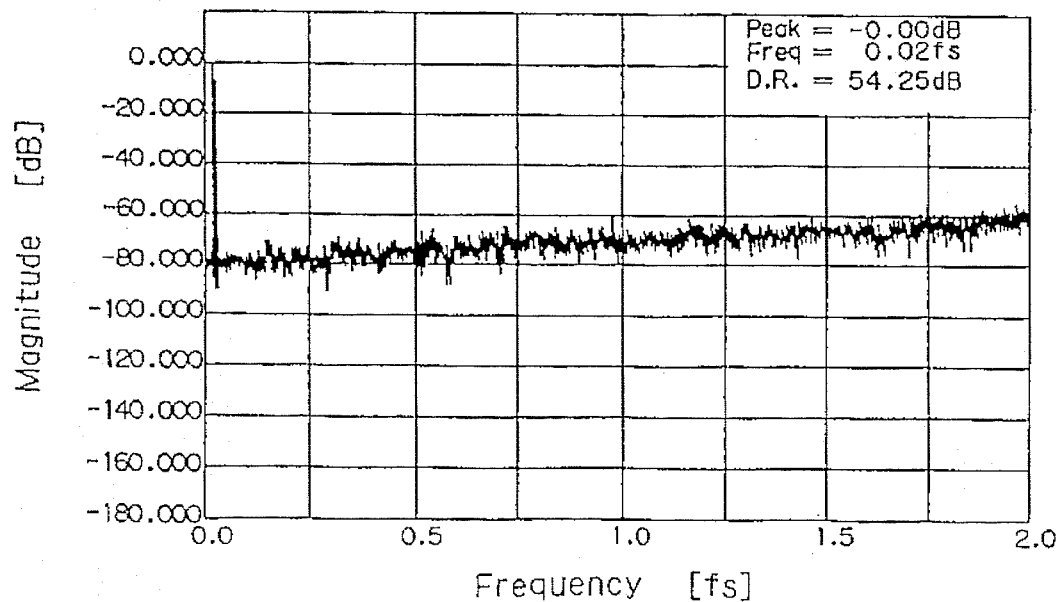
FIG. 18 is an output signal spectrum in the case that operation of the pointer 30 does not depend on the output of the NS 11 and is made to output repeatedly the signals of 0-9 in turn in the A/D conversion apparatus of FIG. 15.

And, although it is here assumed that operation of the pointer 30 accumulates the signals ("00"–"11") of 2 bits output from the quantizer 72 of FIG. 15 derives a remnant of 3 and outputs, as another embodiment of the present invention, the operation of the pointer 30 does not depend on the output of the quantizer 72 but may be output repeatedly the signals of 0–2 in order. Result derived by simulation of the same condition as FIG. 17 on the output signal spectrum in this case is shown in FIG. 18. As seen in FIG. 18, although noise increases in comparison with FIG. 17, the harmonic distortion generated in the case of FIG. 29 is not found, and moreover the dynamic range is improved to about 54 dB. Particularly, in this method, the operation of the pointer 30 is output by the extent repeatedly the signals of 0–2 in order, and the circuit scale of the pointer 30 is reduced because accumulation and calculation of a remnant are not needed.

Subsequently, further embodiment of the present invention is elucidated.

Figure 19:
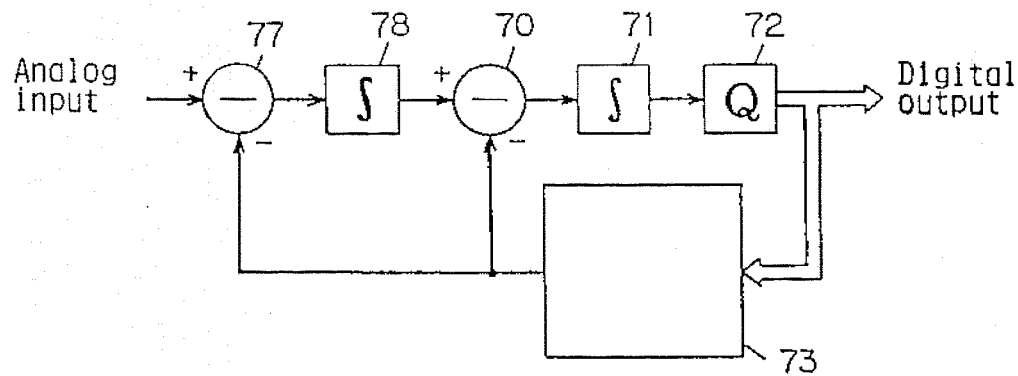
FIG. 19 is a block diagram representing other embodiment of the A/D conversion apparatus in accordance with the present invention.

FIG. 19 is a block diagram representing further embodiment of the A/D conversion apparatus in accordance with the present invention. In FIG. 19, numeral 70 designates the subtracter, numeral 71 designates the integrator, numeral 72 designates the quantizer and numeral 73 designates the D/A converter; and each has the same configuration & function as that shown in FIG. 15. Moreover, numeral 77 designates a subtracter, numeral 78 designates an integrator; and each has the same configuration & function as the subtracter 70 or the integrator 71.

Operation of FIG. 19 is elucidated; first an analog input from outside is inputted to an addition terminal of the subtracter 77, and an analog signal output from the subtracter 77 is accumulated by the accumulator 78 and is output, moreover, is inputted to an addition terminal of the subtracter 70. Successively, the analog signal output from the subtracter 70 is accumulated by the integrator 71 and is output, and above-mentioned output is converted from the analog signal to a digital signal by the quantizer 72, and becomes a digital output. Moreover, this digital output is inputted to the D/A converter 73 too, and is converted to an analog signal, and is inputted to subtraction terminals of the subtracter 77 and the subtracter 70.

The A/D conversion apparatus of FIG. 19 is known as a noise shaping type A/D converter of second order characteristic, and an output Y with respect to an input X is represented by equation (11):

$$Y = X + (1 - z^{-1})^2 \cdot V_q \qquad (11)$$

where, $V_q$: quantization error of quantizer 72, $z^{-1} = \cos\theta - j \cdot \sin\theta$, j: imaginary number unit.

Figure 20:
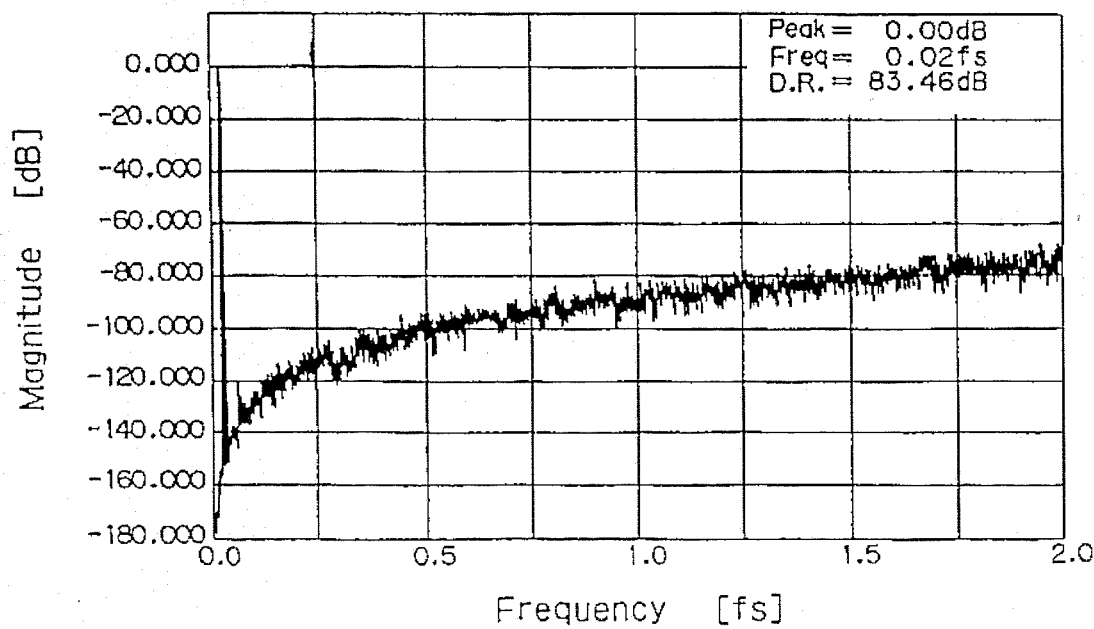
FIG. 20 is a spectrum of an output signal of the A/D converter of FIG. 19.

In the A/D conversion apparatus of FIG. 19, result derived by computer simulation on the output signal spectrum in the case that the sampling frequency (FS) is 64 fs, the input signal frequency is about 0.02 fs and the input signal level is 0 dB is shown in FIG. 20. For simplicity, here, the band until 0–2 fs is shown. As shown in FIG. 20, about 83 dB of dynamic range (D.R.) is obtained in the signal band of 0–fs/2.

Figure 21:
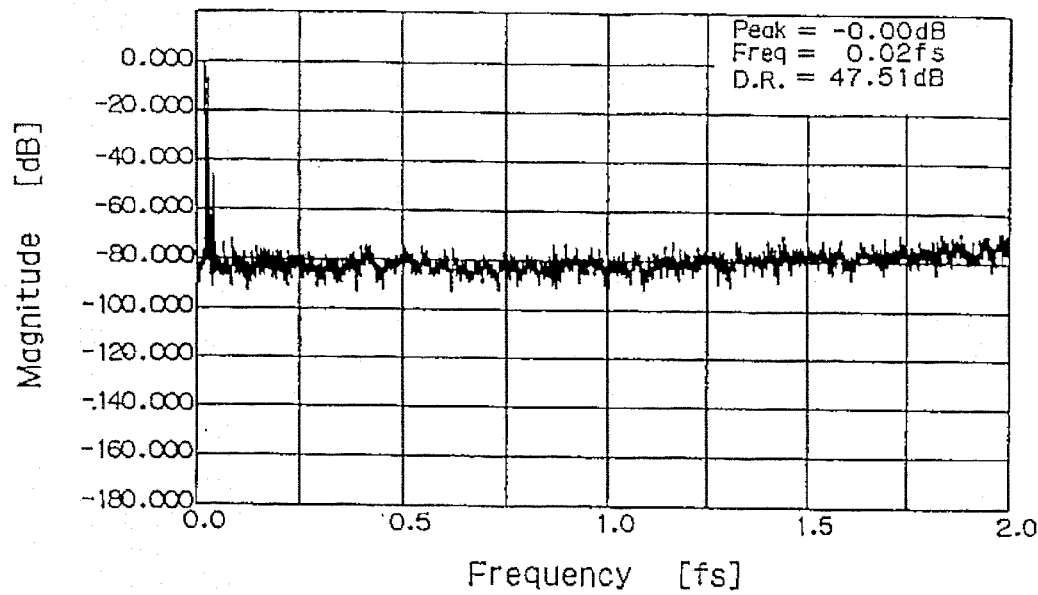
FIG. 21 is an output signal spectrum of the A/D conversion apparatus of FIG. 19 based on Table 2.

It is now assumed that the D/A converter 73 of FIG. 19 has error of 3% as shown in the Table 2 in a manner similar to the D/A converter 79 of FIG. 27, when the output signal spectrum at this time is derived by computer simulation, it becomes as FIG. 21. For simplicity, here, a band until 0–2 fs is shown. As shown in FIG. 21, generation of large harmonic distortion is found, and the dynamic range in the signal band of 0–fs/2 is severely deteriorated to about 48 dB.

Figure 22:
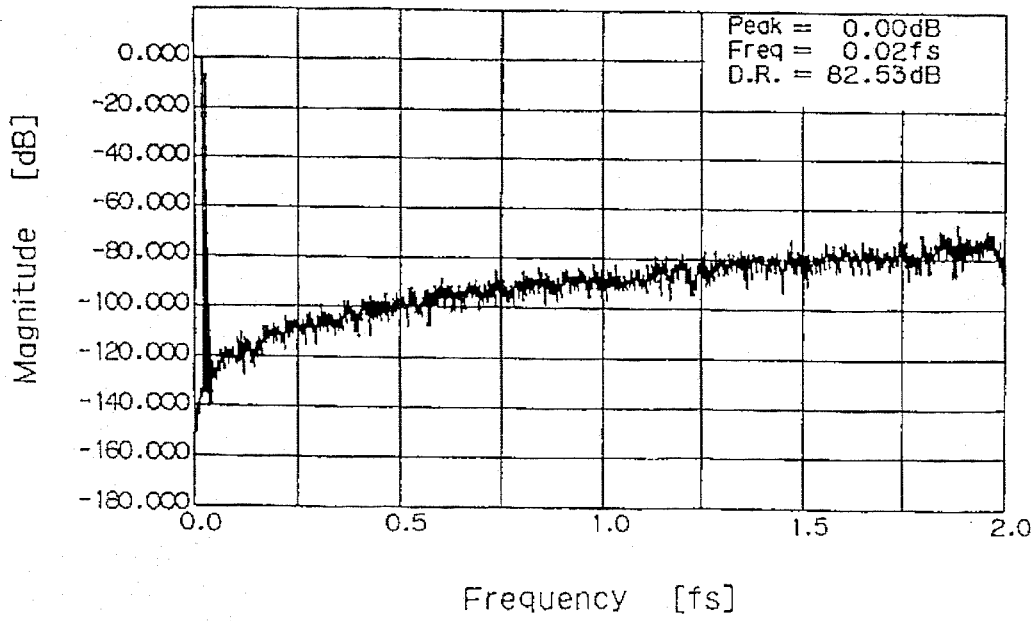
FIG. 22 is an output signal spectrum of the A/D conversion apparatus of FIG. 19 based on Table 15.

On the contrary, in the case that the D/A converter 73 is relevant to the D/A converter 73 of FIG. 15, input-output relation of the ROM 31 of the decoder 74 is made as shown in Table 13, and the output of the 1-bit D/A converter array 75 has 3% of relative error as shown in Table 15, the output signal spectrum becomes as shown in FIG. 22. For simplicity, here, the signal until 0–2 fs is shown. As shown in FIG. 22, it is recognized that the dynamic range is about 83 dB, and deterioration of ability is slight in spite of existence of 3% of relative error in the output of the D/A converter array 75.

Figure 23:
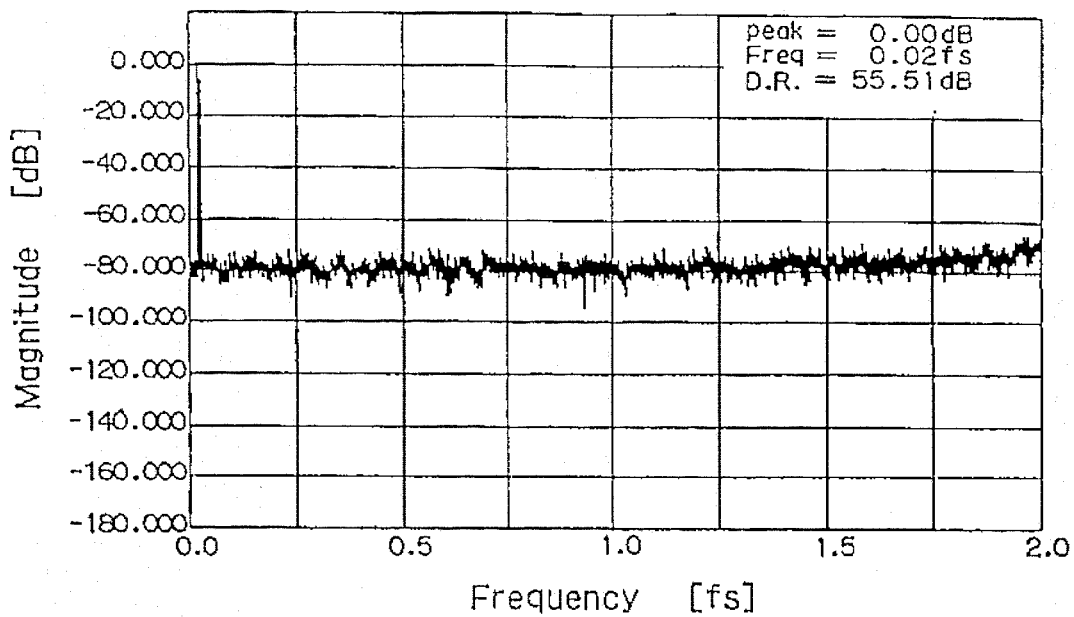
FIG. 23 is an output signal spectrum in the case that operation of the pointer 30 does not depend on the output of the NS 11 but is made to output repeatedly the signals of 0-9 in turn in the A/D conversion apparatus of FIG. 19.

Moreover, as still other embodiment of the present invention, in the D/A converter 73 of FIG. 19, in a similar manner to the D/A converter 73 of FIG. 15, operation of the pointer 30 of FIG. 3 does not depend on the output of the quantizer 72 but may be the one to output the signals of 0–2 repeatedly in order. Result derived by simulation on the output signal spectrum in this case is shown in FIG. 23. As is seen in FIG. 23, although the noise increases in comparison with FIG. 22, the harmonic distortion generated in the case of FIG. 21 is not found, and moreover the dynamic range is improved to about 56 dB.

Even in the case that the relative error exists between the outputs of the 1-bit D/A converter array as this, the A/D conversion apparatus of which generation of the distortion or noise in the signal band is small is realizable. Incidentally, although the A/D conversion apparatus is elucidated herein on FIG. 15 and FIG. 19, if it has a similar function & characteristic, different configuration may be available, and for example, an apparatus performing simultaneously operation of the subtracter 70 and the integrator 71 may be available. Moreover, the configuration of the decoder 74 shown in FIG. 3 and the ROM data etc. of the Table 13 are each one example for elucidation, and of course not limited to these. Moreover, although the number of output bit of the decoder 74 (namely the number of the 1-bit D/A converter 15) is elucidated as (p-1) with respect to the output of p ways of the quantizer 72, any of these are the minimum case, and therefore a number more than this is available in accordance to condition of circuit configuration or the like.

INDUSTRIAL APPLICABILITY

As mentioned above, the D/A conversion apparatus of the present invention, wherein the sampling frequency in D/A conversion may be equal to sampling frequency of the digital output of the noise shaper, has such a superior feature that operation in a clock signal of far lower frequency in comparison with the PWM is available.

Moreover, since the decoder is made to allot the output of the noise shaper so as to circulate to plural 1-bit D/A converters, there is no correlation between the output value of the noise shaper and a specified 1-bit D/A converter; and even in the case that the relative error exists in the output between respective 1-bit D/A converters, it has such a superior feature that generation of the distortion or the noise in the signal band may be decreased.

Moreover, the A/D conversion apparatus of the present invention can decrease generation of distortion or noise in the signal band even in the case that the relative error exists in the output of the 1-bit D/A converter in the above-mentioned D/A conversion circuit, by making the D/A conversion circuit to the D/A conversion apparatus of the present invention; therefore it has superior features that a precision device is not needed for the D/A conversion circuit, it is easy in fabrication and an A/D conversion apparatus with high accuracy A/D conversion apparatus can be realized.

Moreover, in the A/D conversion apparatus of the present invention, by making it the noise shaping type A/D converter of the second order characteristic, the accuracy of A/D conversion may be made further accurate; and furthermore in this case, effect of decreasing generation of the distortion or the noise in the signal band against the relative error existing in the output of the 1-bit D/A converter 15 becomes further remarkable. Moreover, since a lower sampling frequency may be used in order to obtain the A/D conversion accuracy similar to the first order noise shaping type A/D converted, the apparatus may be mnade a low operation speed one.

We claim:

1. A D/A conversion apparatus for converting a digital input signal to an analog output signal the apparatus comprising:

a digital filter having as an input said digital input signal, the digital filter for multiplying a sampling frequency of said digital input signal by k ($k \geq 2$), a noise shaper having as an input an output of said digital filter, the noise shaper for changing a frequency characteristic of noise to a predetermined characteristic with a word limitation, a decoder having as an input an output of said noise shaper, for converting the noise shaper output to a 1-bit signal array, a 1-bit D/A converter array comprised of a plurality of 1-bit D/A converters for converting the 1-bit signal array output of said decoder to corresponding analog signal outputs, and an analog adder for totalizing the outputs of said 1-bit D/A converter array and generating said analog output signal therefrom.

2. A D/A conversion apparatus comprising:

a digital filter for multiplying a sampling frequency of an inputted digital signal by k ($k \geq 2$), a multi-stage quantizing type noise shaper to which an output of said digital filter is inputted for changing a frequency characteristic of noise to a predetermined characteristic with a word length limitation, a plurality of decoders to which outputs of respective stages of said noise shaper are inputted for converting each of the noise shaper outputs to a 1-bit signal array, a 1-bit D/A converter array comprised of a plurality of 1-bit D/A converters for converting respective outputs of said plurality of decoders to analog signals, and an analog adder for totalizing the analog output signals of said 1-bit D/A converter array.

3. An A/D conversion apparatus for converting an analog input signal to a digital output signal, the apparatus comprising:

a subtracter having a subtraction terminal and an addition terminal, to which two analog signals are inputted, respectively and from which an analog output representing a difference of both analog signals is output, an integrator for integrating the analog output of said subtracter, a quantizer for converting an output of said integrator to a digital signal, a decoder for converting the digital signal output from said quantizer to a 1-bit signal array of outputs corresponding to a value of said digital signal, a 1-bit D/A converter array comprising a plurality of 1-bit D/A converters for converting the outputs of said decoder to respective output analog signals, and an analog adder for totalizing the outputs of said 1-bit D/A converter array, wherein an output of said analog adder comprises the analog signal input to the subtraction terminal of said subtracter, the analog input signal comprises the analog signal input to the addition terminal of said subtracter, and the digital output signal comprises said digital signal output of said quantizer.

4. An A/D conversion apparatus for converting an analog input to a digital output, comprising:

a first subtracter having an addition terminal and a subtraction terminal to which two analog signals are inputted and from which an analog output representing a difference of both analog signals is output, a first integrator for integrating the analog output of said first subtracter and generating an analog output therefrom, a second subtracter having an addition terminal and a subtraction terminal, wherein the analog output of said first integrator is inputted to the addition terminal, the second subtracter generating an analog output, a second integrator for integrating the analog output of said second subtracter, a quantizer for converting an output of said second integrator to a digital signal, a decoder for converting the digital signal output of said quantizer to a 1-bit signal array, a 1-bit D/A converter array comprising a plurality of 1-bit D/A converters for converting the outputs of said decoder to respective analog signals, and an analog adder for totalizing the outputs of said 1-bit D/A converter array and outputting a signal to the subtraction terminals of said first and second subtracters, wherein the analog input is inputted to the addition terminal of said first subtracter, and the digital output is output from said quantizer.

5. The D/A conversion apparatus of claim 1, wherein the 1-bit signal array output of said decoder comprises at least a 1-bit signal array of (p-1) corresponding to the noise shaper output signal having a value of P where P is an integer, and the 1-bit signal array is allotted by circulating in a manner that a starting position of allotment of said 1-bit signal array becomes a next position of a final allotment position of said 1-bit signal array of a previous sample data.

6. The D/A conversion apparatus of claim 1, wherein the 1-bit signal array output of said decoder comprises at least a 1-bit signal array of (p-1) corresponding to the noise shaper output signal having the value of p, where p is an integer and a starting point of allotment of said 1-bit signal array circulates by a predetermined number every 1 sample data.

7. The D/A conversion apparatus of claim 5, wherein the plurality of 1-bit D/A converters corresponding to the 1-bit signal array of said decoder output are arranged such that polarity of an error with an average output level of said 1-bit D/A converter is opposed and an absolute value of said error is closed.

8. The D/A conversion apparatus of claim 5, wherein the plurality of 1-bit D/A converters comprises m D/A converters, m being an integer, and when each 1-bit D/A converter of m in said 1-bit D/A converter array is made to DAC-1, DAC-2, DAC-3, DAC-4, . . . , DAC-(m-3), DAC-(m-2), DAC-(m-1), DAC-m in the order of the output level, the 1-bit D/A converter is allotted in arrangement of DAC-1, DAC-(m-1), DAC-3, DAC-(m-3), . . . , DAC-4, DAC-(m-2), DAC-2, DAC-m with respect to the 1-bit signal array output from said decoder.

9. The D/A conversion apparatus of claim 5, wherein the plurality of 1-bit D/A converters are accorded to respective group, each group corresponding to a respective decoder and each group is allotted in the order of the output level of said 1-bit D/A converter array.

10. The D/A conversion apparatus of claim 2, wherein the multi-stage noise shaper comprises a two stage configuration, the plurality of decoders comprises a first decoder and a second decoder to which the outputs of said noise shaper are inputted, respectively, and the plurality of D/A converters are grouped into a first group and a second group, respectively, wherein the groups corresponding to each output of said decoders allot in the order of an output level of the 1-bit D/A converter in said 1-bit D/A converter array, the first group of 1-bit D/A converters is arranged in inverse order of the output level, and the second group of 1-bit D/A converters is arranged in the order of the output level.

11. The D/A conversion apparatus of claim 5, wherein each 1-bit D/A converter in said 1-bit D/A converter array is allotted in an order such that the output of said decoder is near to the center with respect to the order of the output level of said 1-bit D/A converter.

12. The D/A conversion apparatus of claim 2, wherein the multi-stage noise shaper comprises a two stage configuration, the plurality of decoders comprises a first decoder and a second decoder to which the outputs of said noise shaper are inputted, respectively, and the plurality of D/A converters are grouped into a first group and a second group, respectively, wherein the groups are made to allot both end parts to the first group with respect to the order of the output level of the 1-bit D/A converter in said 1-bit D/A converter array, and to allot a central part of a remainder to the second group, and said first group is arranged in the order of the output level, and said second group is arranged in inverse order of the output level.

13. The D/A conversion apparatus of claim 2, wherein the 1-bit signal array output of said decoders comprises at least a 1-bit signal array of (p-1) corresponding to the noise shaper output signals having a value of P where P is an integer, and the 1-bit signal array is allotted by circulating in a manner that a starting position of allotment of said 1-bit signal array becomes a next position of a final allotment position of said 1-bit signal array of a previous sample data.

14. The D/A conversion apparatus of claim 13, wherein the plurality of 1-bit D/A converters corresponding to the 1-bit signal array output of said decoders are arranged such that polarity of an error with an average output level of said 1-bit D/A converters is opposed and an absolute value of said error is closed.

15. The D/A conversion apparatus of claim 13, wherein the plurality of 1-bit D/A converters comprises m D/A converters, m being an integer, and when each 1-bit D/A converter of m in said 1-bit D/A converter array is made to DAC-1, DAC-2, DAC-3, DAC-4, . . . , DAC-(m-3), DAC-(m-2), DAC-(m-1), DAC-m in the order of the output level, the 1-bit D/A converter is allotted in arrangement of DAC-1, DAC-(m-1), DAC-3, DAC-(m-3), . . . , DAC-4, DAC-(m-2), DAC-2, DAC-m with respect to the 1-bit signal array output from said decoders.

16. The D/A conversion apparatus of claim 13, wherein the plurality of 1-bit D/A converters are accorded to respective groups, each group corresponding to a respective decoder and each group is allotted in the order of the output level of said 1-bit D/A converter array.

17. The D/A conversion apparatus of claim 13, wherein each 1-bit D/A converter in said 1-bit D/A converter array is allotted in an order such that the output of said decoders is near to the center with respect to the order of the output level of said 1-bit D/A converter.

18. The D/A conversion apparatus of claim 2, wherein the 1-bit signal array output of said decoders comprises at least a 1-bit signal array of (p-1) corresponding to the output signals of the noise shapers having the value of p, where p is an integer, and a starting point of allotment of said 1-bit signal array circulates by a predetermined number every 1 sample data.

19. The A/D conversion apparatus of claim 3, wherein the 1-bit signal array output of said decoder comprises at least a 1-bit signal array of (p-1) corresponding to the digital signal output of said quantizer having a value of P, where P is an integer, and the 1-bit signal array is allotted by circulating in a manner that a starting position of allotment of said 1-bit signal array becomes a next position of a final allotment position of said 1-bit signal array of a previous sample data.

20. The A/D conversion apparatus of claim 19, wherein the plurality of 1-bit D/A converters corresponding to the 1-bit signal array of said decoder output are arranged such that polarity of an error with an average output level of said 1-bit D/A converter is opposed and an absolute value of said error is closed.

21. The A/D conversion apparatus of claim 19, wherein the plurality of 1-bit D/A converters comprises m D/A converters, m being an integer, and when each 1-bit D/A converter of m in said 1-bit D/A converter array is made to DAC-1, DAC-2, DAC-3, DAC-4, . . . , DAC-(m-3), DAC-(m-2), DAC-(m-1), DAC-m in the order of the output level, the 1-bit D/A converter is allotted in arrangement of DAC-1, DAC-(m-1), DAC-3, DAC-(m-3), ..., DAC-4, DAC-(m-2), DAC-2, DAC-m with respect to the 1-bit signal array output from said decoder.

22. The A/D conversion apparatus of claim 19, wherein the plurality of 1-bit D/A converters are accorded to respective groups and each group is allotted in the order of the output level of said 1-bit D/A converter array.

23. The A/D conversion apparatus of claim 19, wherein each 1-bit D/A converter in said 1-bit D/A converter array is allotted in an order such that the output of said decoder is near to the center with respect to the order of the output level of said 1-bit D/A converter.

24. The A/D conversion apparatus of claim 3, wherein the 1-bit signal array output of said decoder comprises at least a 1-bit signal array of (p-1) corresponding to the quantizer output signal having the value of p, where p is an integer, and a starting point of allotment of said 1-bit signal array circulates by a predetermined number every 1 sample data.

25. The A/D conversion apparatus of claim 4, wherein the 1-bit signal array output of said decoder comprises at least a 1-bit signal array of (p-1) corresponding to the digital signal output of said quantizer having a value of P, where P is an integer, and the 1-bit signal array is allotted by circulating in a manner that a starting position of allotment of said 1-bit signal array becomes a next position of a final allotment position of said 1-bit signal array of a previous sample data.

26. The A/D conversion apparatus of claim 25, wherein the plurality of 1-bit D/A converters corresponding to the 1-bit signal array of said decoder output are arranged such that polarity of an error with an average output level of said 1-bit D/A converter is opposed and an absolute value of said error is closed.

27. The A/D conversion apparatus of claim 25, wherein the plurality of 1-bit D/A converters comprises m D/A converters, m being an integer, and when each 1-bit D/A converter in said 1-bit D/A converter array is made to DAC-1, DAC-2, DAC-3, DAC-4, . . . , DAC-(m-3), DAC-(m-2), DAC-(m-1), DAC-m in the order of the output level, the 1-bit D/A converter is allotted in arrangement of DAC-1, DAC-(m-1), DAC-3, DAC-(m-3), . . . , DAC-4, DAC-(m-2), DAC-2, DAC-m with respect to the 1-bit signal array output from said decoder.

28. The A/D conversion apparatus of claim 25, wherein the plurality of 1-bit D/A converters are accorded to respective groups and each group is allotted in the order of the output level of said 1 bit D/A converter array.

29. The A/D conversion apparatus of claim 25, wherein each 1-bit D/A converter in said 1-bit D/A converter array is allotted in an order such that the output of said decoder is near to the center with respect to the order of the output level of said 1-bit D/A converter.

30. The A/D conversion apparatus of claim 4, wherein the bit signal array output of said decoder comprises at least a 1-bit signal array of (p-1) corresponding to the quantizer output signal having the value of p, where p is an integer, and a starting point of allotment of said 1-bit signal array circulates by a predetermined number every 1 sample data.

* * * * *